US009882708B2

(12) United States Patent
Oh et al.

(10) Patent No.: US 9,882,708 B2
(45) Date of Patent: Jan. 30, 2018

(54) MULTI-RATE TRANSCEIVER CIRCUITRY

(71) Applicant: Altera Corporation, San Jose, CA (US)

(72) Inventors: Boon Hong Oh, Bukit Mertajam (MY); Chee Wai Yap, Perai (MY)

(73) Assignee: Altera Corporation, San Jose ( * ) Notice: Subject to any disclaimer, the term of this patent is extended or adjusted under 35 U.S.C. 154(b) by 44 days.

(21) Appl. No.: 15/047,413

(22) Filed: Feb. 18, 2016

(65) Prior Publication Data

US 2016/0164668 A1 Jun. 9, 2016

Related U.S. Application Data

(62) Division of application No. 14/271,348, filed on May 6, 2014, now Pat. No. 9,300,463.

(60) Provisional application No. 61/975,675, filed on Apr. 4, 2014.

(51) Int. Cl.
| H04L 7/02 | (2006.01) |
| H04L 23/00 | (2006.01) |
| H04L 7/033 | (2006.01) |
| H04L 7/00 | (2006.01) |
| H03M 9/00 | (2006.01) |
| G09G 5/00 | (2006.01) |
| H04N 7/015 | (2006.01) |

(52) U.S. Cl.
CPC ........... *H04L 7/0332* (2013.01); *G09G 5/006* (2013.01); *H03M 9/00* (2013.01); *H04L 7/0087* (2013.01); *G09G 2370/10* (2013.01); *H04N 7/015* (2013.01)

(58) Field of Classification Search
CPC ...... H04W 28/22; H04L 1/0002; H04L 7/033; H04L 2001/0098; H04B 7/264; H04N 5/38; G06F 5/06
USPC .................................................. 375/355, 377
See application file for complete search history.

(56) References Cited

U.S. PATENT DOCUMENTS

| 5,317,391 | A | 5/1994 | Banker et al. |
| 5,420,923 | A | 5/1995 | Beyers et al. |
| 6,167,077 | A | 12/2000 | Ducaroir et al. |
| 7,091,890 | B1* | 8/2006 | Sasaki ..................... H03K 5/135 |
| | | | 341/100 |
| 7,376,767 | B1 | 5/2008 | Black et al. |
| 7,747,793 | B1 | 6/2010 | Black et al. |
| 8,108,567 | B2 | 1/2012 | Bohm |
| 8,340,208 | B2* | 12/2012 | Fukuda ............... H04L 25/4917 |
| | | | 341/56 |

(Continued)

*Primary Examiner* — Tesfaldet Bocure

(57) ABSTRACT

Techniques to operate circuitry in an integrated circuit are provided. The circuitry may include a receiver circuit and one of the provided techniques includes receiving a data stream at the receiver circuit. The receiver circuit may include a detector circuit that is used to determine the data rate of the received data stream. A controller block in the receiver circuit may accordingly configure a deserializer circuit in the receiver circuit based on the data rate of the received data stream. The circuitry may further include a transmitter circuit for transmitting data streams. The transmitter circuit may be configured during runtime based on the data rate of a data stream that is being transmitted. In some instances, irrespective of the data rate of the data stream being transmitted, a constant reference clock may be used in the transmitter circuit.

19 Claims, 25 Drawing Sheets

(56) References Cited

U.S. PATENT DOCUMENTS

| | | |
|---|---|---|
| 2003/0142233 A1* | 7/2003 | Eckhardt .................. H04N 5/46 |
| | | 348/512 |
| 2006/0133809 A1* | 6/2006 | Chow .................... H04J 3/1694 |
| | | 398/66 |
| 2009/0232234 A1 | 9/2009 | Du |
| 2011/0142443 A1* | 6/2011 | Hirth ..................... H04J 3/1694 |
| | | 398/25 |
| 2012/0011418 A1 | 1/2012 | Gaur |
| 2014/0044441 A1* | 2/2014 | Hirth ..................... H04B 10/69 |
| | | 398/209 |
| 2014/0181355 A1* | 6/2014 | Barbiero ............. G06F 13/4022 |
| | | 710/316 |
| 2015/0045016 A1 | 2/2015 | Xiong et al. |
| 2015/0101002 A1 | 4/2015 | Yamashita |

\* cited by examiner

MULTI-RATE TRANSCEIVER CIRCUITRY

This application is a division of U.S. Pat. No. 9,300,463, issued on Mar. 29, 2016, which claims the benefit of U.S. provisional patent application No. 61/975,675, filed Apr. 4, 2014. This application claims the benefit of and claims priority to U.S. Pat. No. 9,300,463, issued on Mar. 29, 2016, and U.S. provisional patent application No. 61/975,675, filed Apr. 4, 2014, which are hereby incorporated by reference herein in their entireties.

BACKGROUND

Integrated circuit devices, such as field programmable gate array (FPGA) devices and application specific integrated circuits (ASICs), may perform a wide array of functions and as such, may be employed in different systems. When used in a larger system, an integrated circuit device may communicate with other external elements (e.g., another integrated circuit device, a memory module, etc.) via a variety of input-output standards. Such a device may therefore include circuitry to support different interfaces.

As an example, an integrated circuit device that supports high definition video streams may include a serial digital interface (SDI) circuit (or other applicable interface circuitry). As is generally known, the SDI standard may be used to transfer uncompressed digital video signals. The high-definition SDI (HD-SDI) standard, for example, provides a data rate of 1.485 Gigabits per second (Gbps) via a single link. A related interface, the dual-link HD-SDI interface, provides a 2.970 Gbps data rate over a pair of interface links. More recently, the 3G-SDI standard has been introduced to transfer data at 2.970 Gbps over a single link.

Generally, the dual-link HD-SDI interface may be used to transmit signals at 720 p (progressive scan or non-interlaced) resolution while the 3G-SDI interface may be used to transmit signals at 1080 p resolution. However, as performance requirements increase and higher resolutions are introduced, input-output interfaces such as SDI may need to be adapted to support higher data rates. For example, in order to support ultra-high-definition video streams (4K resolution video streams with 4000 horizontal pixels or even 8K resolution with 8000 horizontal pixels), multi-link interfaces, composed of several 3G SDI links, may be needed.

As an example, in order to transmit 4K video streams at 30 frames per second (fps), two 3G-SDI links may be required. Accordingly, four 3G-SDI links are required to transmit 4K video streams at 60 fps. As higher resolutions require higher data rates, more cables or links are needed to transmit video streams at higher resolutions (4K, 8K and beyond). Such a solution is therefore both cumbersome and costly.

It is within this context that the embodiments described herein arise.

SUMMARY

Multi-rate circuitry and techniques for supporting data or video streams at different resolutions or frame rates are provided. Embodiments provided herein allow high resolution video streams to be transmitted via a single link. It is appreciated that the present invention can be implemented in numerous ways, such as a process, an apparatus, a system, or a device. Several inventive embodiments of the present invention are described below.

Generally, an integrated circuit, or more specifically transceiver circuitry on the integrated circuit, may be adapted to receive or transmit data streams at different data rates. A method of operating a receiver circuit may include receiving a data stream at the receiver circuit. The receiver circuit may include a detector circuit, a controller block, and a deserializer circuit. The data rate of the received data stream may be determined using the detector circuit. The deserializer circuit is accordingly configured with the controller block based on the data rate of that particular data stream. In one scenario, the receiver circuit may receive a constant reference clock signal irrespective of the data rate of the received data stream. In this scenario, the received data stream may accordingly be oversampled at different rates.

A method of operating a transmitter circuit that may be included in transceiver circuitry in an integrated circuit may include determining a data rate of a data stream being transmitted out of a transmitter circuit. Based on the data rate of the data stream that is being transmitted, a control signal may be set. In one scenario, the control signal may be used to configure circuitry within the transmitter circuit. In this scenario, a scrambler circuit is configured based on the control signal. As an example, the data width of the scrambler circuit may be set based on the control signal.

Circuitry that may support data streams at different data rates may be referred to as multi-rate receiver circuitry. In one embodiment, such receiver circuitry may include a deserializer circuit and an oversampler circuit. The deserializer circuit may receive data streams from an external source (an external element or circuit that is coupled to the receiver circuitry). The deserializer circuit has an adjustable data width that is determined by the data rate of a received data stream. The oversampler circuit may receive the data stream from the deserializer circuit and sample the data stream based on the data rate of that data stream. In one scenario, the receiver circuitry may be configured to operate at the highest possible data rate and the oversampling mechanism may thus be scaled accordingly based on the data rate of the received data stream.

Configurable transmitter circuitry that may support data streams of different data rates may include multiple protocol blocks. At least one of the protocol blocks may be enabled to transmit a data stream. A scrambler circuit is coupled to the protocol blocks. Different numbers of protocol blocks may be enabled or disabled based on the data rate of the data stream being transmitted. The scrambler circuit may be configurable during runtime (e.g., during normal operation of the transmitter circuitry) based on the data rate of the data rate being transmitted.

BRIEF DESCRIPTION OF THE DRAWINGS

FIGS. 3A-1-3D-1 and 3D-2 show individual blocks within the respective protocol blocks shown in FIGS. 3A-3D that are enabled or disabled based on the type of data stream being transmitted in accordance with embodiments of the present invention.

Figure 4A:
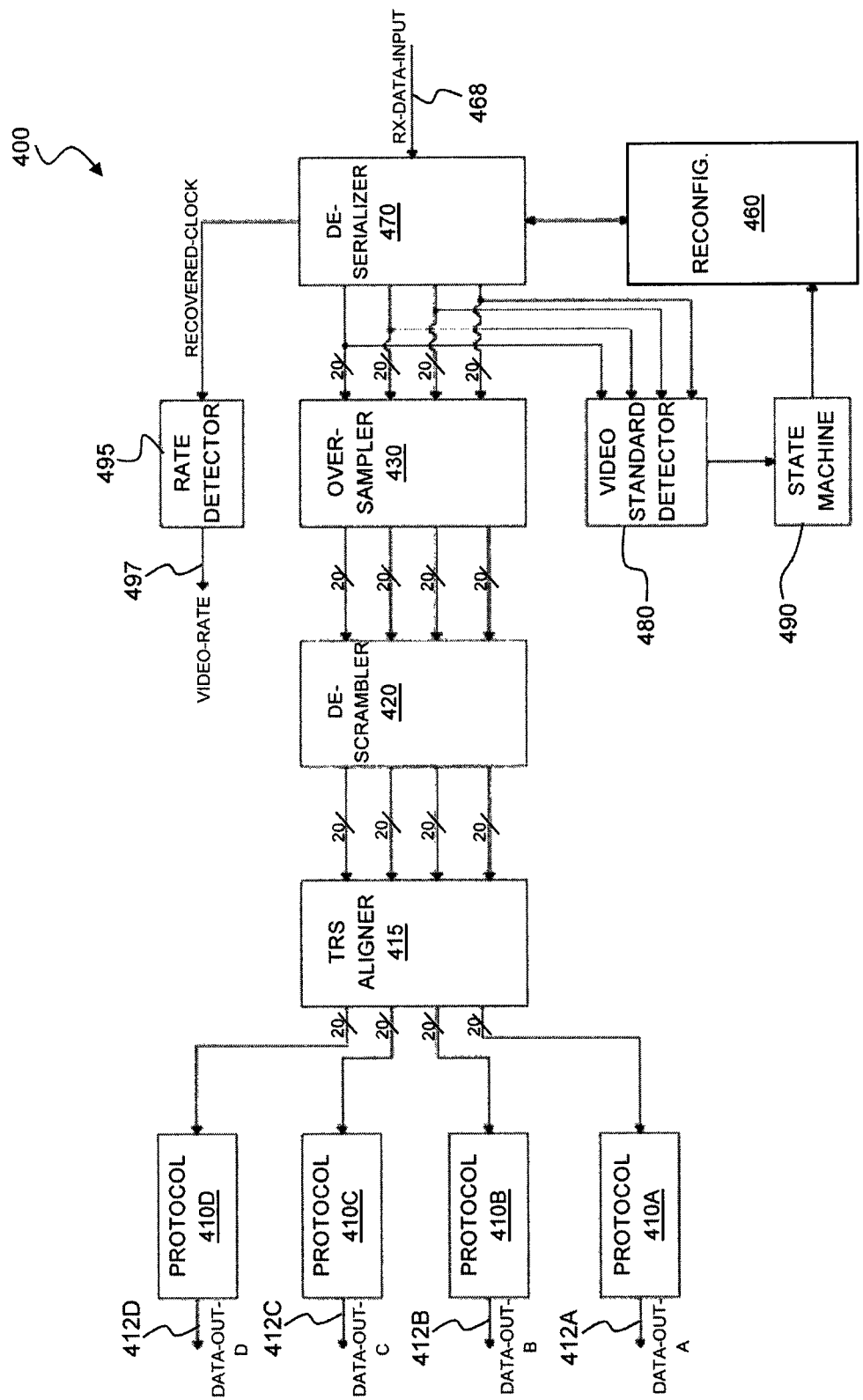

FIG. 4A shows an illustrative scalable multi-rate receiver circuit in accordance with embodiments of the present invention.

Figure 4B:
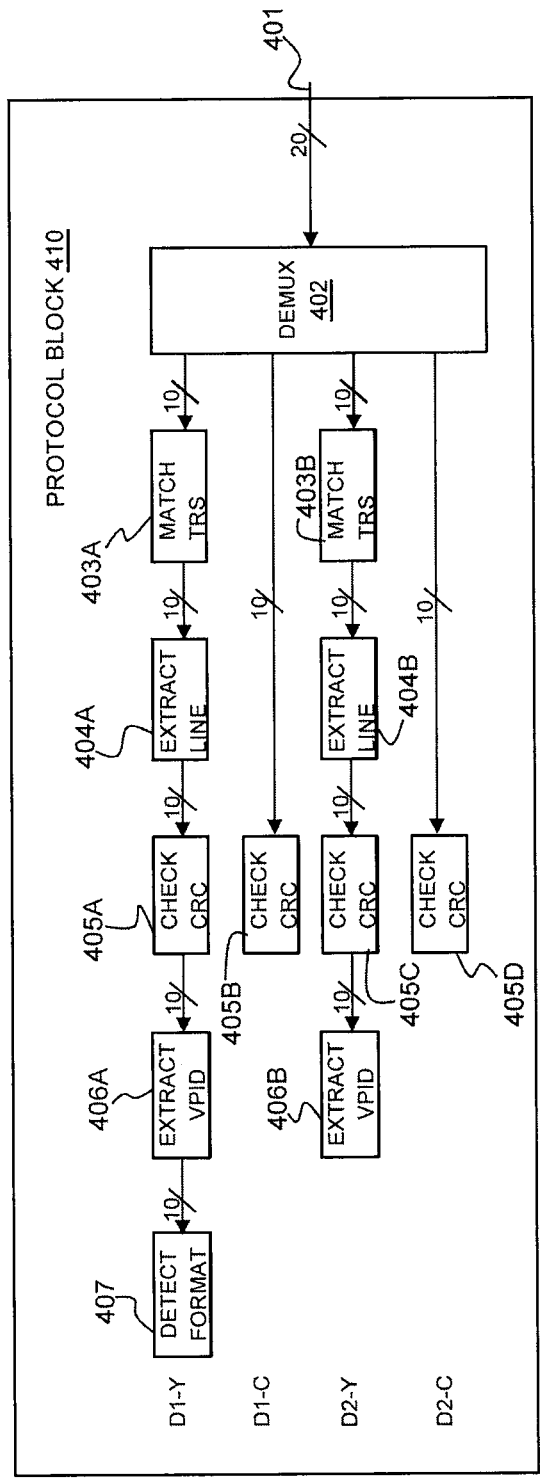

FIG. 4B shows a more detailed representation of a protocol block in a receiver circuit in accordance with embodiments of the present invention.

FIGS. 5A-5D show a receiver circuit with specific protocol blocks (or individual logic blocks within selected protocol blocks) being enabled or disabled based on the type of data stream received in accordance with embodiments of the present invention.

FIGS. 5A-1-5D-1 and 5D-2 show individual logic blocks within the respective protocol blocks shown in FIGS. 5A-5D that are enabled or disabled based on the type of data stream being transmitted in accordance with embodiments of the present invention.

Figure 6:
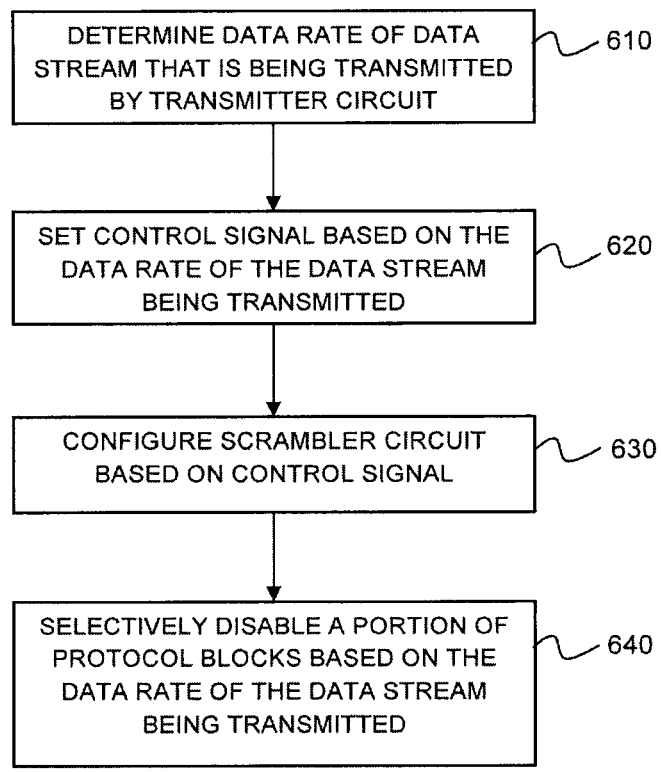

FIG. 6 shows illustrative method steps for operating transceiver circuitry in an integrated circuit in accordance with embodiments of the present invention.

Figure 7:
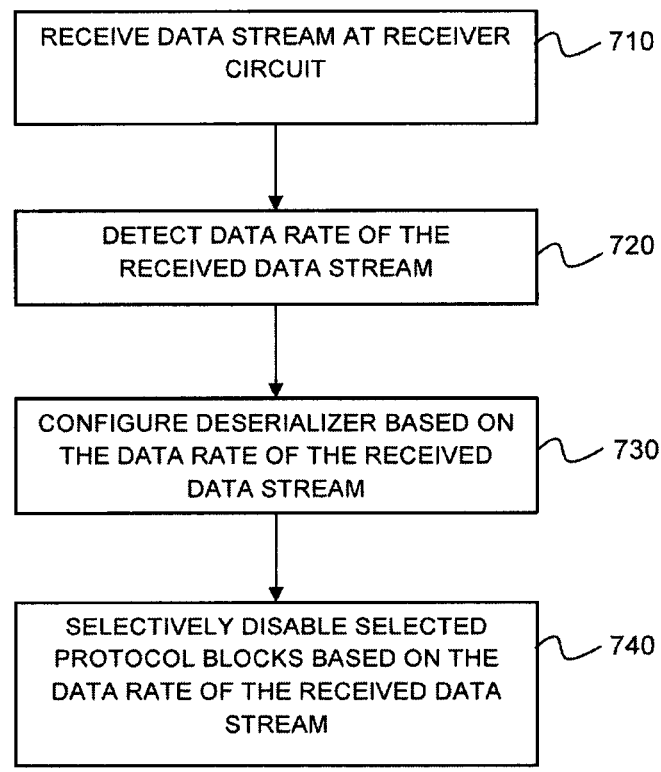

FIG. 7 shows illustrative method steps for operating a receiver circuit within transceiver circuitry in an integrated circuit in accordance with embodiments of the present invention.

DETAILED DESCRIPTION

The embodiments provided herein include circuitry and techniques to implement multi-rate transceiver circuitry in an integrated circuit (IC).

It will be obvious to one skilled in the art that the present exemplary embodiments may be practiced without some or all of these specific details. In other instances, well-known operations have not been described in detail in order not to unnecessarily obscure the present embodiments.

Figure 1:
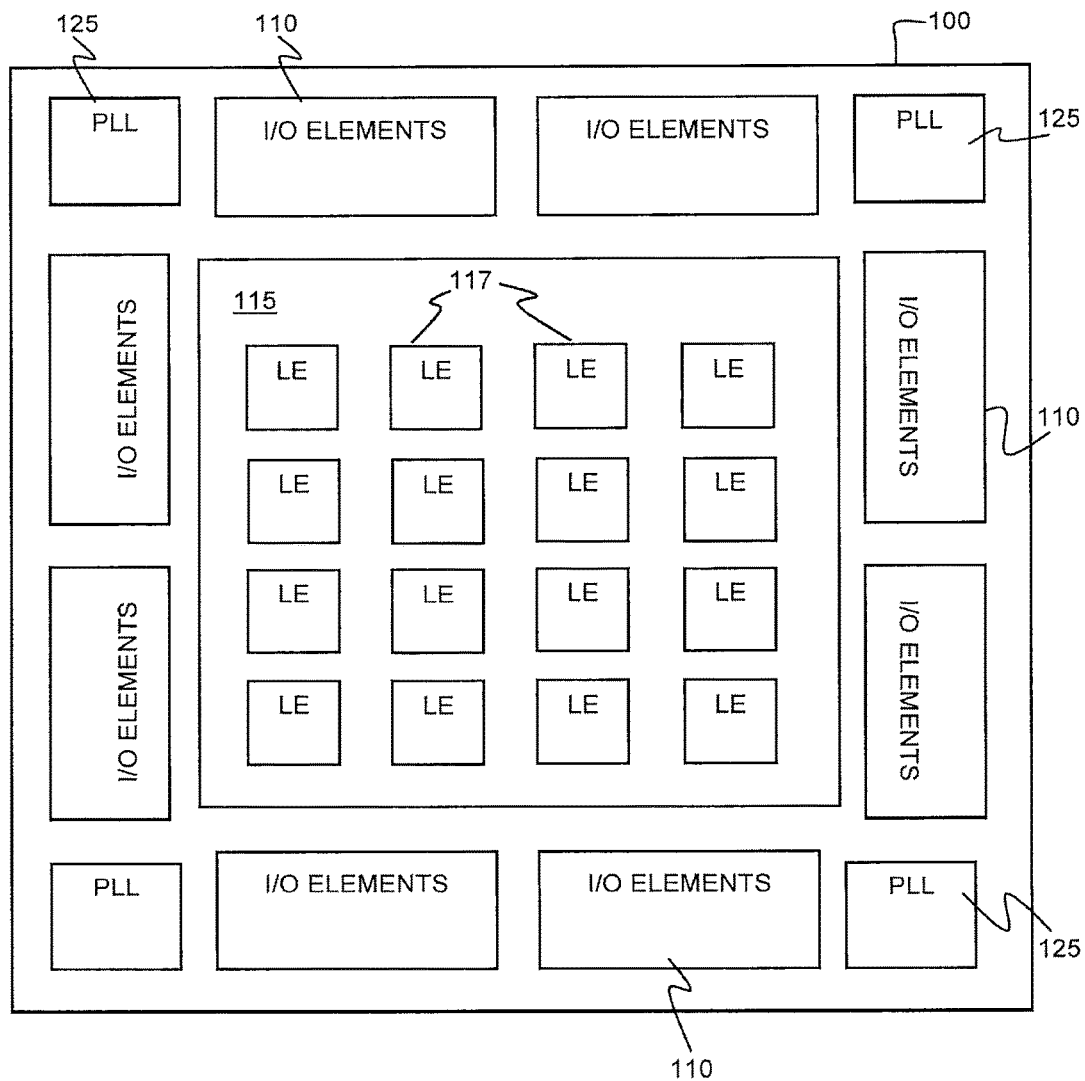
FIG. 1 is a block diagram of an illustrative integrated circuit in accordance with embodiments of the present invention.

An IC device, such as a field-programmable gate array (FPGA) device or an application specific integrated circuit (ASIC) device, generally includes high-speed input-output circuitry, including, among others, transceiver circuitry. FIG. 1, meant to be illustrative and not limiting, shows a block diagram of IC 100 that can implement embodiments of the present invention. Generally, an IC device such as IC 100 includes core logic region 115 and input-output elements 110. Other auxiliary circuits, such as phase-locked loops (PLLs) 125 for clock generation and timing, may be located outside the core logic region 115 (e.g., at corners of IC 100 and adjacent to input-output elements 110).

Core logic region 115 may be populated with logic cells that include "logic elements" (LEs) 117, among other circuits. LEs 117 may include look-up table-based logic regions and may be grouped into "Logic Array Blocks" (LABs). LEs 117 and groups of LEs or LABs can be configured to perform logical functions desired by the user. Configuration data loaded into configuration memory may be used to produce control signals that configure LEs 117 and groups of LEs and LABs to perform the desired logical functions.

Signals received from external circuitry at input-output elements 110 may be routed from input-output elements 110 to core logic region 115 and other logic blocks on IC 100. Core logic region 115 and other logic blocks on IC 100 may accordingly perform functions based on the signals received.

Signals may be sent from core logic region 115 and other relevant logic blocks of IC 100 to other external circuitry or components that may be connected to IC 100 through input-output elements 110. A single device like IC 100 can potentially support a variety of different interfaces and each individual input-output bank 110 can support a different input-output standard with a different interface or protocol (e.g., high-speed serial interface protocol).

In the embodiment of FIG. 1, input-output elements 110 may include input-output buffers and high-speed transceiver circuitry that connect IC 100 to other external components. Generally, transceiver circuitry may include transmitter and receiver circuits that communicate with external components via different interfaces. In one scenario, transceiver circuitry (not shown) in IC 100 may receive and transmit video streams at different resolutions and data rates. As an example, the transceiver circuitry may be scalable to support multi-rate transmissions via a single link (e.g., a coaxial cable that connects IC 100 to a display, etc.). While FIG. 1 describes an embodiment of a programmable IC, it should be appreciated that any ASIC device may take advantage of the circuitry and methods described below.

Figure 2A:
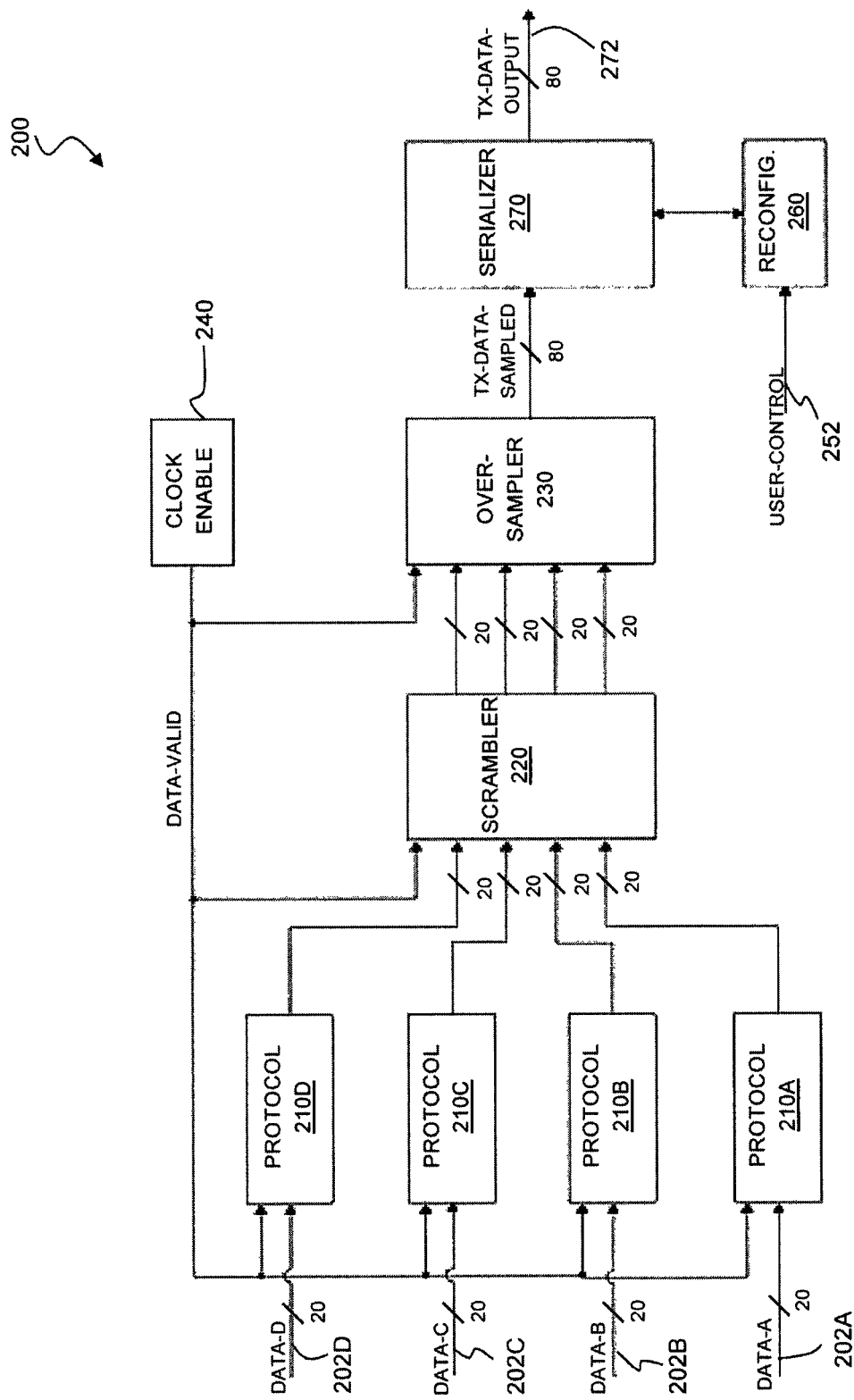
FIG. 2A shows an illustrative multi-rate transmitter circuit in accordance with embodiments of the present invention.

FIG. 2A shows an illustrative multi-rate transmitter circuit 200 in accordance with embodiments of the present invention. Transmitter circuit 200 includes four protocol blocks 210A-210D, scrambler circuit 220, oversampler circuit 230, clock enable circuit 240, reconfiguration controller circuit 260, and serializer circuit 270. Transmitter circuit 200 may transmit video streams at different data rates and resolutions. In one scenario, transmitter circuit 200 may transmit video streams with data rates ranging from 270 megabits per second (Mbps) to 11.88 gigabits per second (Gbps).

In the embodiment of FIG. 2A, transmitter circuit 200 may be part of an IC device similar to IC 100. Accordingly, input terminals 202A-202D may convey data streams from the core region (e.g., core region 115) of the IC device to respective protocol blocks 210A-210D in transmitter circuit 200. Each of the input terminals 202A-202D may be a 20-bit input terminal that receives a 20-bit data stream (data streams DATA-A, DATA-B, DATA-C, and DATA-D, respectively). This example is merely illustrative and the input terminals may have any desired bit-width for receiving data streams. Depending on the data stream being transmitted, selected protocol blocks 210A-210D may be enabled or disabled. Specific details of protocol blocks 210A-210D and how they may be enabled and disabled based on the data rate of the data streams being transmitted will be explained below with reference to FIG. 2B and FIGS. 3A-3D.

Each of the protocol blocks 210A-210D receives a signal from clock enable circuit 240. In one embodiment, clock enable circuit 240 may generate a clock enable or a data valid signal (shown as DATA-VALID in FIG. 2A) for protocol blocks 210A-210D, scrambler circuit 220, and oversampler circuit 230 based on the data rate of the data stream being transmitted. As an example, transmitter circuit 200 may receive a constant reference clock signal (e.g., a 148.5 MHz or 148.35 MHz clock signal) and clock enable circuit 240 may be configured such that it outputs a constant logic high signal as the DATA-VALID signal when transmitter circuit 200 is transmitting either a 3 gigabits per second (3G), 6G or 12G data stream. Clock enable circuit 240 may output alternating logic high and logic low levels at every clock cycle when transmitter circuit 200 is transmitting a high-definition (HD) data stream at 1.485 or 1.4835 Gbps.

As shown in FIG. 2A, data streams DATA-A, DATA-B, DATA-C and DATA-D transmitted to the respective protocol blocks 210A-210D are transmitted to scrambler circuit 220. It should be noted that scrambler circuit 220 may iteratively apply scrambling and non-return-to-zero-inverted (NRZI)

encoding algorithms to each bit of the data stream being transmitted (specific details of the NRZI algorithm are not described herein in order to not unnecessarily obscure the present invention). In one embodiment, scrambler circuit 220 may accept or receive 10, 20, 40, or 80 bits of data from the respective protocol blocks 210A-210D. For example, input data width of scrambler circuit 220 may be set to 10, 20, 40 and 80 bits for standard definition (SD) transmission, high definition (HD) transmission/3 gigabit per second (3G) transmission, 6G transmission, and 12G transmission, respectively.

The outputs of scrambler circuit 220 are coupled to oversampler circuit 230. Accordingly, data streams from scrambler circuit 220 may be oversampled by oversampler circuit 230 by a predetermined factor. It should be noted that oversampler circuit 230 may transmit oversampling data by repeating each bit of the input data stream by a given number of times. In one scenario, the data width of the output TX-DATA-SAMPLED of oversampler circuit 230 may be fixed (e.g., fixed at 80 bits) and the data stream being transmitted may accordingly be oversampled based on its number of input bits.

As an example, transmitter circuit 200 may be set to operate with a constant reference clock signal (e.g., 148.5 MHz or 148.35 MHz) and at a specific default data rate (e.g., 11.88 Gbps or 11.868 Gbps). Accordingly, any data stream that is being transmitted that is below the default data rate may be oversampled by a sampling factor. When transmitter circuit 200 is transmitting a 12G data stream (an 11.88 or 11.868 Gbps data stream), oversampler circuit 230 may be bypassed (i.e., the data stream is not oversampled or the data stream is oversampled by a factor of one). When transmitter circuit 200 is transmitting a 6G data stream, the data stream may be oversampled two times, and when transmitter circuit 200 is transmitting a 3G data stream, the data stream may be oversampled by a factor of four relative to its default data rate.

The oversampled data stream TX-DATA-SAMPLED is accordingly transmitted to serializer circuit 270. The data stream TX-DATA-SAMPLED is serialized by serializer 270 in transmitter circuit 200 and transmitted externally as TX-DATA-OUTPUT at output terminal 272. In the embodiment of FIG. 2A, serializer circuit 270 may be coupled to reconfiguration controller circuit 260 that receives USER-CONTROL signal at input terminal 252. Reconfiguration controller circuit 260 may allow a user to configure transmitter circuit 200 to operate at different data rates. Depending on the USER-CONTROL signal received at input terminal 252, transmitter circuit 200 may be switched between 1/1.000 (Phase Alternating Line (PAL)) and 1/1.001 (National Television System Committee (NTSC)) data rates. In one scenario, there may be two phase locked loop (PLL) circuits (not shown) referenced at 148.5 MHz and 148.35 MHz, respectively, in serializer circuit 270. In this scenario, reconfiguration controller circuit 260 may selectively reconfigure transmitter circuit 200 (or more specifically, serializer circuit 270) to operate using either one of the PLL circuits. The reconfiguration may be performed at run-time depending on the data rate of the data stream being transmitted by transmitter circuit 200.

Figure 2B:
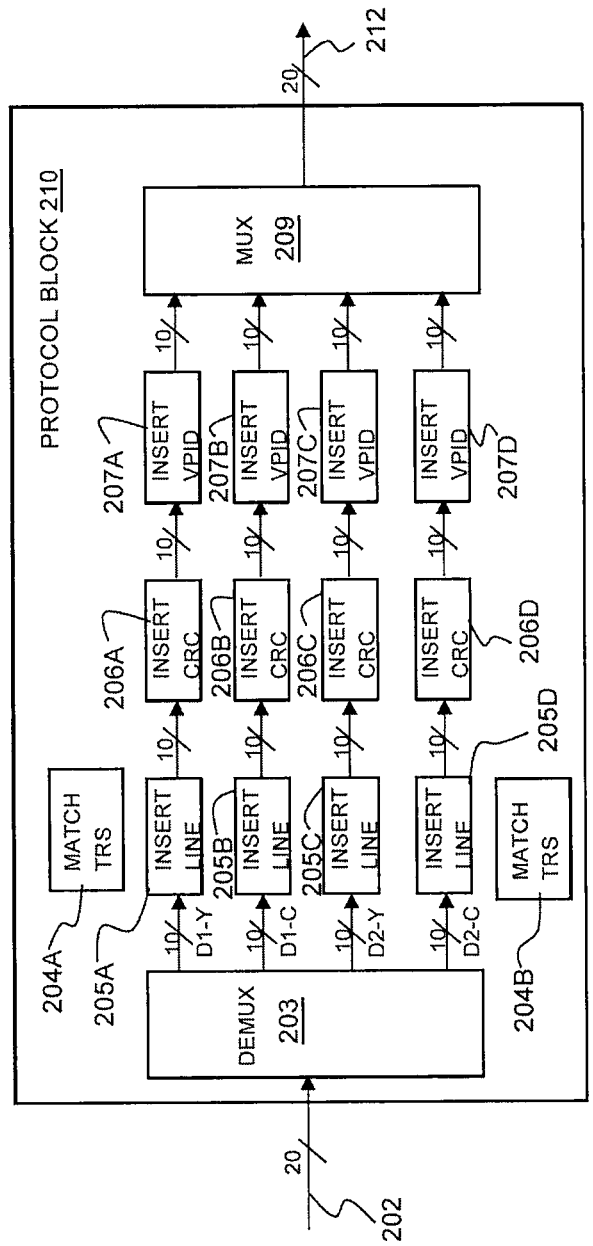
FIG. 2B shows a more detailed representation of a protocol block in a transmitter circuit in accordance with embodiments of the present invention.

FIG. 2B shows a more detailed representation of a protocol block in a transmitter circuit in accordance with embodiments of the present invention. As an example, protocol block 210 may be any one of protocol blocks 210A-210D described above with reference to FIG. 2A. In one scenario, protocol block 210 may be used to implement a serial digital interface (SDI) standard. Accordingly, protocol block 210 includes demultiplexing circuit 203, match timing reference signal (TRS) blocks 204A and 204B, insert line blocks 205A-205D, insert cyclic redundancy check (CRC) blocks 206A-206D, insert video payload identification (VPID) blocks 207A-207D, and multiplexing circuit 209. As shown in FIG. 2A, each of the protocol blocks 210A-210D may receive a 20-bit data input (e.g., DATA-A, DATA-B, DATA-C, and DATA-D) and transmit a 20-bit data output to scrambler circuit 220. Similarly, protocol block 210 in FIG. 2B receives a 20-bit input at input terminal 202 and transmits a 20-bit output at output terminal 212.

As is generally known, the SDI standard may be a 10-bit wide serial data format or a 20-bit wide data format (in HD applications). Accordingly, protocol block 210 may be utilized to support HD data applications where a 20-bit wide data stream is divided into two parallel 10-bit data streams, which are then further divided into luminance Y and chrominance C streams (e.g., D1-Y, D1-C, D2-Y and D2-C) by demultiplexing circuit 203. In one scenario, outputs D1-Y and D2-Y from demultiplexing circuit 203 may represent the luminance samples of the data stream being transmitted while outputs D1-C and D2-C may represent the chrominance samples of that data stream. It should be noted that the actual color models or color encoding formats that may be used to convey color information of a video stream are not described in detail in order to not unnecessarily obscure the present invention.

Insert line blocks 205A-205D may insert or assign line numbers in the respective data streams D1-Y, D1-C, D2-Y and D2-C. It should be appreciated that in the SDI standard, a synchronization packet, or commonly referred to as a TRS packet, may be included in the data stream. Accordingly, match TRS blocks 204A and 204B may indicate to the respective insert line blocks 205A-205D (i.e., TRS block 204A may signal to insert line blocks 205A and 205B while TRS block 204B may signal to insert line blocks 205C and 205D) when to insert line numbers into the respective data streams.

Insert CRC blocks 206A-206D may be used to insert CRC codes, calculated based on the SDI specification, into the data streams. Match TRS modules 204A and 204B may accordingly indicate to the respective insert CRC blocks 206A-206D when to calculate and insert the CRC values into their respective streams. Accordingly, insert VPID blocks 207A-207D may insert VPID packets into the respective data streams. The VPID packets may carry information such as the interface type, sampling structure, component bit depth, and picture update rate of the video stream being transmitted. The VPID packet may be inserted immediately after the CRC code in a data stream. Multiplexing circuit 209 may then combine the 10-bit data streams to obtain the original 20-bit data format that is transmitted out of protocol block 210 via output terminal 212.

As shown in FIG. 2A, the output from each of the protocol blocks 210A-210D is transmitted to scrambler circuit 220 in transmitter circuit 200. As mentioned above with reference to FIG. 2A, selected protocol blocks 210A-210D may be enabled or disabled, depending on the resolution or data rate of the data stream being transmitted. Accordingly, specific blocks associated with individual data streams within each of the protocol blocks 210A-210D (e.g., insert line blocks 205A-205D, insert CRC blocks 206A-206D, and insert VPID blocks 207A-207D as shown in FIG. 2B) may be enabled and disabled at any one time based on the data stream being transmitted.

FIGS. 3A-3D show transmitter circuit 300 with specific protocol blocks and FIGS. 3A-1, 3B-1, 3C-1, 3D-1 and 3D-2 show individual blocks within the respective protocol blocks that are enabled or disabled based on the type of data stream being transmitted in accordance with embodiments of the present invention. It should be noted that transmitter circuit 300 shown in FIGS. 3A-3D shares similarities with transmitter circuit 200 of FIG. 2A and protocol blocks shown in FIGS. 3A-1-3D-1 and 3D-2 share similarities with protocol block 210 of FIG. 2B. As such, similar circuit elements or features shown in FIGS. 3A-3D and FIGS. 3A-1-3D-1 share the same reference numerals, incremented by 100, with those shown in FIGS. 2A and 2B.

Figure 3A:
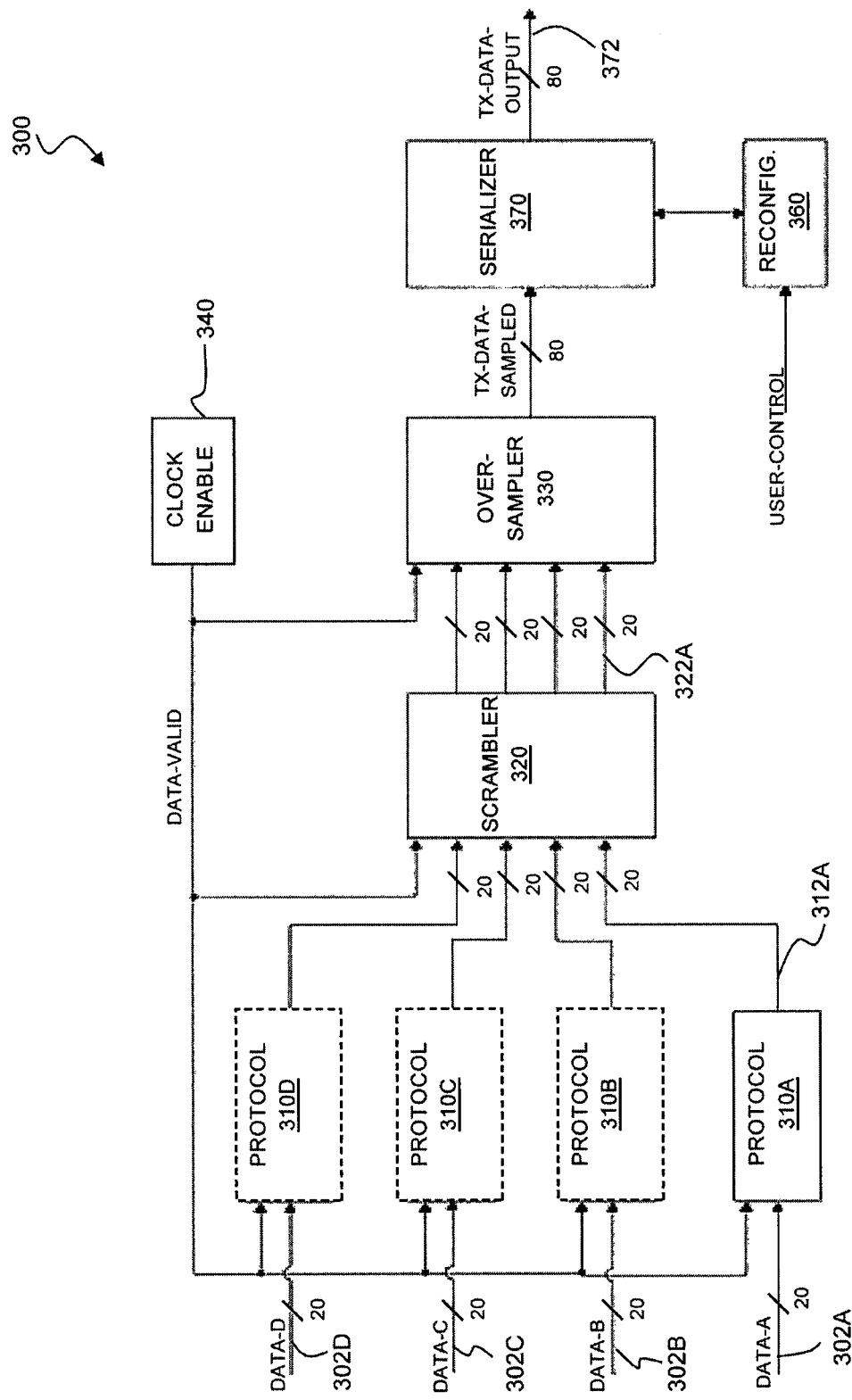
FIGS. 3A-3D show a transmitter circuit with specific protocol blocks (or individual blocks within selected protocol blocks) being enabled or disabled based on the type of data stream being transmitted in accordance with embodiments of the present invention.
Figures 1, 3A:
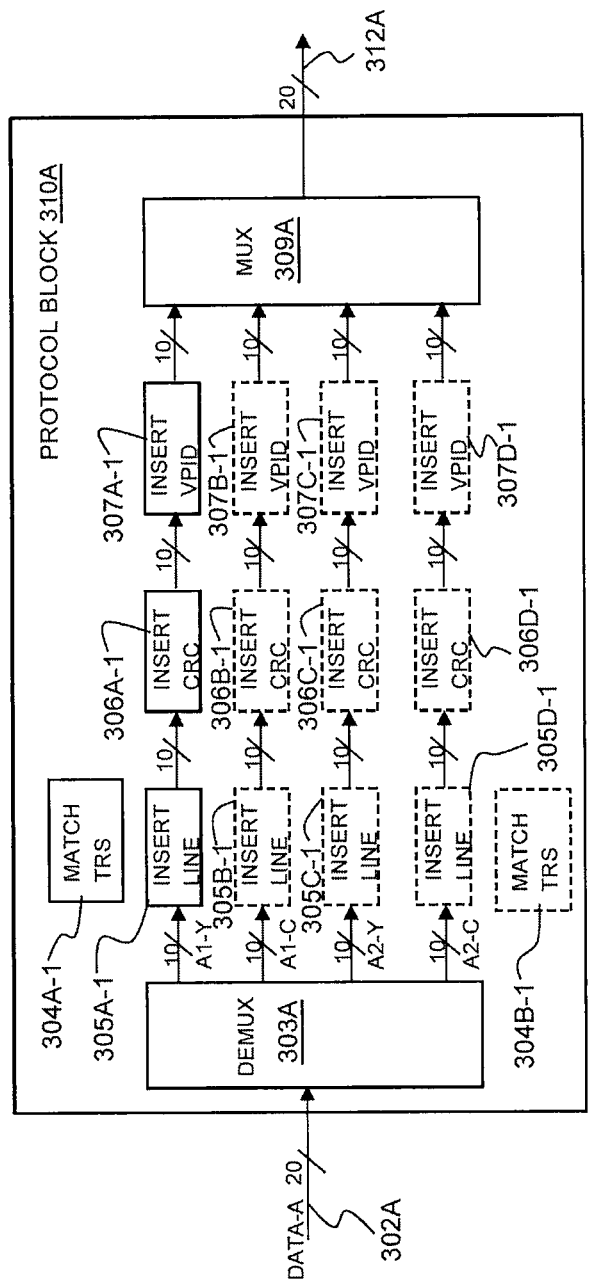

FIG. 3A shows protocol blocks in transmitter circuit 300 and FIG. 3A-1 shows selected data paths in protocol block 310A that are disabled when transmitting a standard definition (SD) video stream at 270 Mbps. When transmitting such a video stream, protocol blocks 310B-310D may be disabled (disabled protocol blocks are represented with dotted lines). As shown in FIG. 3A, only protocol block 310A that is associated with data stream DATA-A at input terminal 302A may be enabled. Other input terminals 302B, 302C and 302D that are associated with data streams DATA-B, DATA-C and DATA-D, respectively, may be accordingly disabled. In one scenario, transmitter circuit 300 may receive a constant reference clock signal (e.g., a 148.5 MHz clock signal) and operate at a constant clock rate. In this scenario, when transmitting a 270 Mbps data stream using a constant reference clock signal of 148.5 MHz, clock enable circuit 340 may provide a DATA-VALID signal to protocol block 310A, scrambler circuit 320 and oversampler circuit 330 at every 11 clock cycles.

FIG. 3A-1 shows selected data paths or logic blocks in protocol block 310A that are disabled (disabled logic blocks are represented with dotted lines) when transmitting an SD video stream at 270 Mbps. A 20-bit data stream DATA-A may be transmitted from input terminal 302A to demultiplexing circuit 303A in protocol block 310A. Generally, an SD data or video stream may be 10 bits wide. As such, in one scenario, the 20-bit data stream received at terminal 302A may carry a luminance (Y) component at the upper 10 bits and a chrominance (C) component at the lower 10 bits of the 20-bit data stream. Accordingly demultiplexing circuit 303A may convert the received 20-bit data stream into 10-bit basic streams with interleaved Y and C components.

Each of the 10-bit basic streams is transmitted as data stream A1-Y to insert line block 305A-1, insert CRC block 306A-1, and insert VPID block 307A-1 for processing (details of how the data stream may be processed by the respective blocks in protocol block 210 are explained above with reference to FIG. 2B). As only 10-bit basic streams are processed in this scenario, insert line blocks 305B-1-305D-1, insert CRC blocks 306B-1-306D-1, insert VPID blocks 307B-1-307D-1, and match TRS block 304B-1 may be disabled. Multiplexing circuit 309A may then reproduce the 10-bit basic stream to its original 20-bit data stream format before transmitting the data stream to scrambler circuit 320 in FIG. 3A via output terminal 312A.

Referring back to FIG. 3A, the input and output data widths of scrambler circuit 320 may be set to 20 bits respectively when transmitter circuit 300 is transmitting an SD data stream (e.g., the input terminals of scrambler circuit 320 that are coupled to the respective protocol blocks 310B-310D may be disabled). The 20-bit data output 322A from scrambler circuit 320 is transmitted to oversampler circuit 330. In one scenario, transmitter circuit 300 may be configured to operate at a default data rate of 11.88 Gbps. In this scenario, oversampler circuit 330 may oversample the received data stream by 44 times (270 Mbps×44=11.88 Gbps) before transmitting the oversampled data stream TX-DATA-SAMPLED to serializer circuit 370. As mentioned above, serializer circuit 370 serializes the data stream before transmitting serialized TX-DATA-OUPUT out of transmitter circuit 300 via output terminal 372.

Figure 3B:
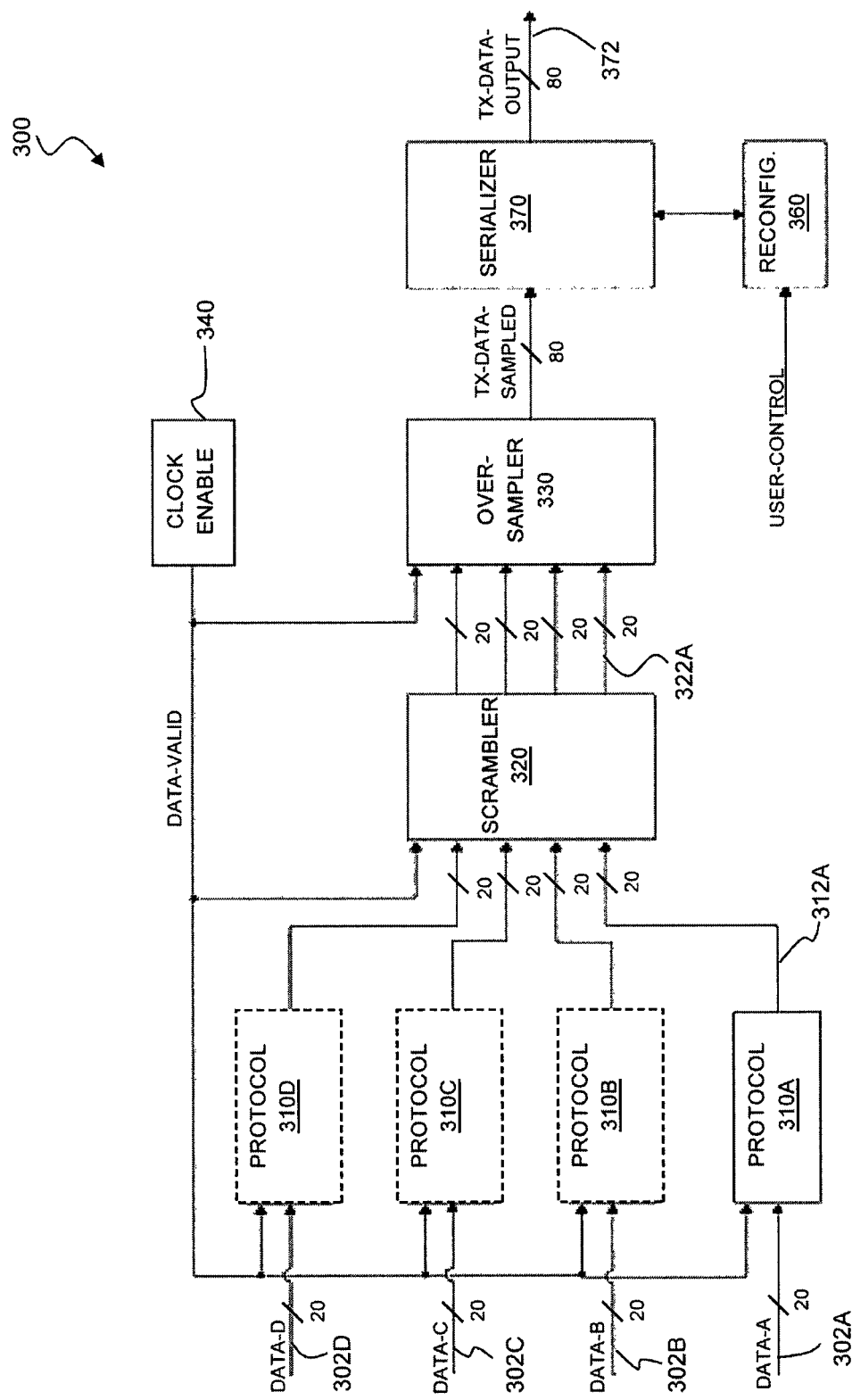
Figures 1, 3B:
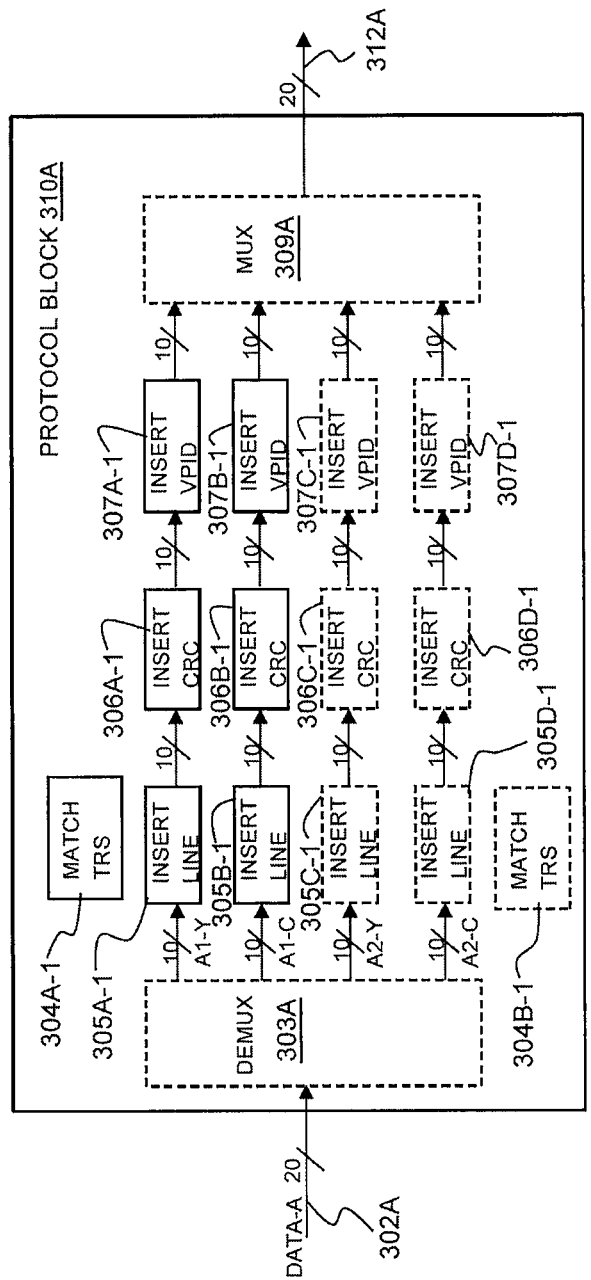

FIG. 3B shows protocol blocks in transmitter circuit 300 and FIG. 3B-1 shows selected data paths or logic blocks in protocol block 310A that are disabled when transmitting a high definition (HD) video stream (e.g., a 1.485 (or 1.4835) or a 2.97 (or 2.967) Gbps HD video stream). In the embodiment of FIG. 3B, protocol block 310A is enabled while protocol blocks 310B-310D are disabled. Input terminal 302A associated with data stream DATA-A is enabled while other input terminals 302B, 302C and 302D that are associated with data streams DATA-B, DATA-C and DATA-D, respectively, may be disabled.

In the embodiment of FIG. 3B, a 20-bit data stream may be transmitted from input terminal 302A to protocol block 310A. FIG. 3B-1 shows selected data paths or logic blocks in protocol block 310A that are disabled (disabled logic blocks are represented with dotted lines) when transmitting an HD video stream at 1.485 (or 1.4835) or a 2.97 (or 2.967) Gbps. As is generally known, an HD stream (either 1.485 or 1.4835 Gbps, or 2.97 or 2.967 Gbps) may be 20 bits wide with the upper 10 bits representing the luminance component and the lower 10 bits representing the chrominance component of the video stream. In this context, demultiplexing circuit 303A in protocol block 310A may be disabled or bypassed.

As an example, the upper 10 bits of the 20-bit data stream may be transmitted as a 10-bit data stream A1-Y directly to insert line block 305A-1 and the lower 10 bits of the 20-bit data stream may be transmitted as a 10-bit data stream A1-C directly to insert line block 305B-1. The respective data streams are then transmitted to insert CRC blocks 306A-1 and 306B-1, and insert VPID blocks 307A-1 and 307B-1 for processing. Match TRS block 304B-1 and other insert line blocks 305C-1 and 305D-1, insert CRC blocks 306C-1 and 306D-1, and insert VPID blocks 307C-1 and 307D-1 in protocol block 310A may be disabled. In this example, multiplexing circuit 309A in protocol block 310A may also be disabled as the complete 20-bit data stream may be transmitted directly to scrambler circuit 320 of FIG. 3B via output terminal 312A.

Referring back to FIG. 3B, as mentioned, transmitter circuit 300 may receive a constant reference clock signal (e.g., a 148.5 MHz or 148.35 MHz clock signal) and operate at a constant clock rate. Accordingly, when transmitter circuit 300 is transmitting an HD data stream at either 1.485 or 1.4835 Gbps, clock enable circuit 340 may generate an enable signal or DATA-VALID signal at every two clock cycles. When transmitter circuit 300 is transmitting a 3G HD data stream at either 2.97 or 2.967 Gbps, clock enable circuit 340 may generate a constant asserted DATA-VALID or clock enable signal. The DATA-VALID signal from clock enable circuit may be transmitted to protocol block 310A, scrambler circuit 320, and oversampler circuit 330.

In one embodiment, the input and output data widths of scrambler circuit 320 may be set to 20 bits respectively when transmitter circuit 300 is transmitting an HD data stream. The 20-bit data output 322A from scrambler circuit 320 is transmitted to oversampler circuit 330. Transmitter circuit 300 may be configured to operate at a default data rate of 11.88 Gbps or 11.868 Gbps. In one scenario, when transmitter circuit 300 is transmitting an HD video stream at 1.485 or 1.4835 Gbps, oversampler circuit 330 may oversample the received video stream by eight times (1.485

Gbps×8=11.88 Gbps; 1.4835 Gbps×8=11.868 Gbps) before transmitting the oversampled data stream TX-DATA-SAMPLED to serializer circuit 370. In another scenario, when transmitter circuit 300 is transmitting a 3G HD video stream at 2.97 or 2.967 Gbps, oversampler circuit 330 may oversample the video stream by four times (2.97 Gbps×4=11.88 Gbps; 2.967 Gbps×4=11.868 Gbps). The oversampling factor may depend on the ratio between the default data rate of transmitter circuit 300 and the data rate of the data stream being transmitted. The serialized oversampled data stream is then transmitted as TX-DATA-OUTPUT via output terminal 372.

It should be noted that the different data rates for the HD video stream (e.g., 1.485 and 1.4835 Gbps) and the 3G HD video stream (e.g., 2.97 and 2.967 Gbps) may represent different video standards, such as PAL and NTSC. In one embodiment, transmitter circuit 300 may be switched between the PAL and NTSC standard depending on the data rate of the data stream being transmitted. In one scenario, respective PLL circuits (not shown) in serializer circuit 370 may be referenced at 148.5 MHz and 148.35 MHz. In this scenario, reconfiguration controller circuit 360 may selectively reconfigure transmitter circuit 300 (or more specifically, serializer circuit 370), at runtime, to operate using either one of the PLL circuits.

Figure 3C:
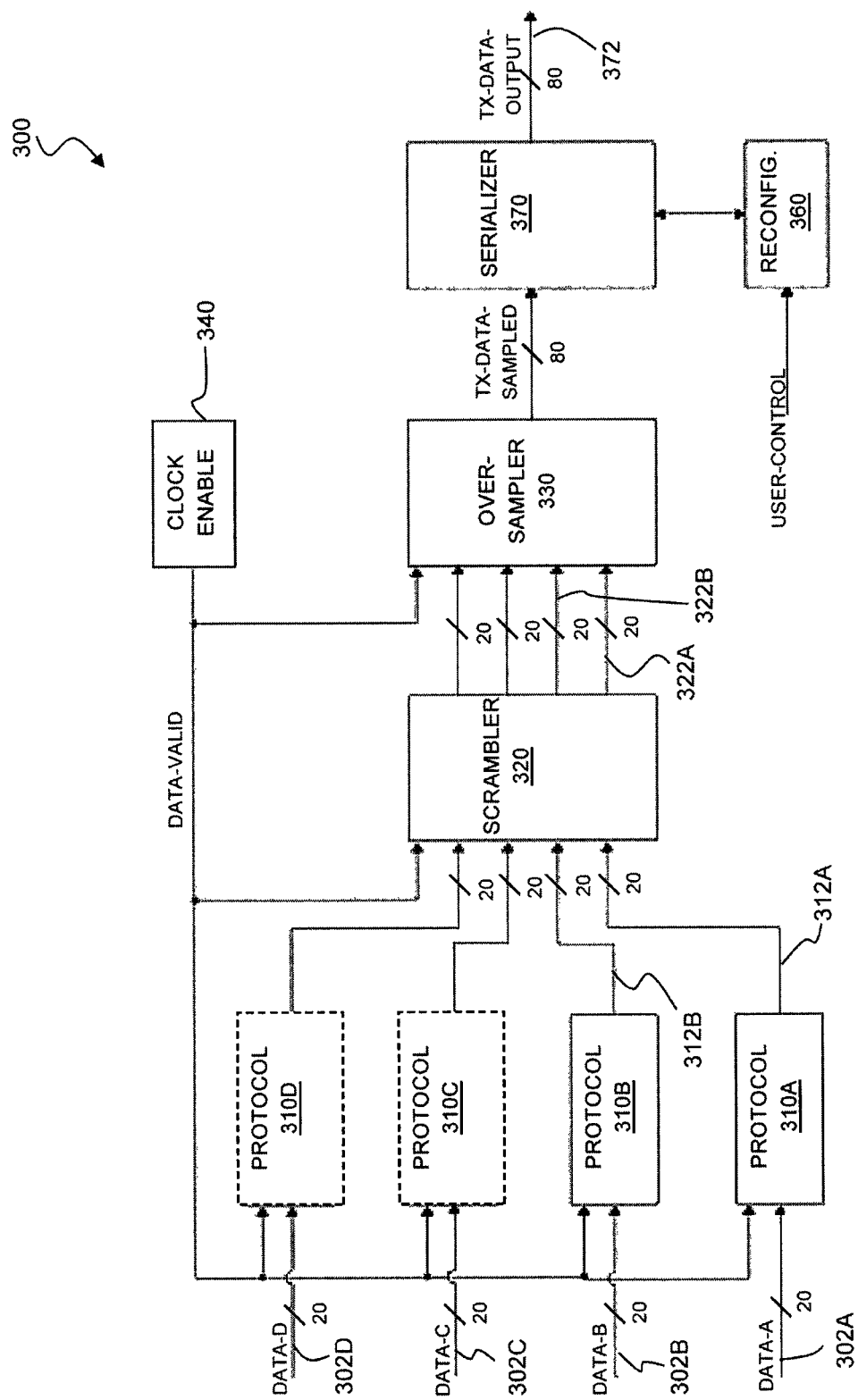
Figures 1, 3C:
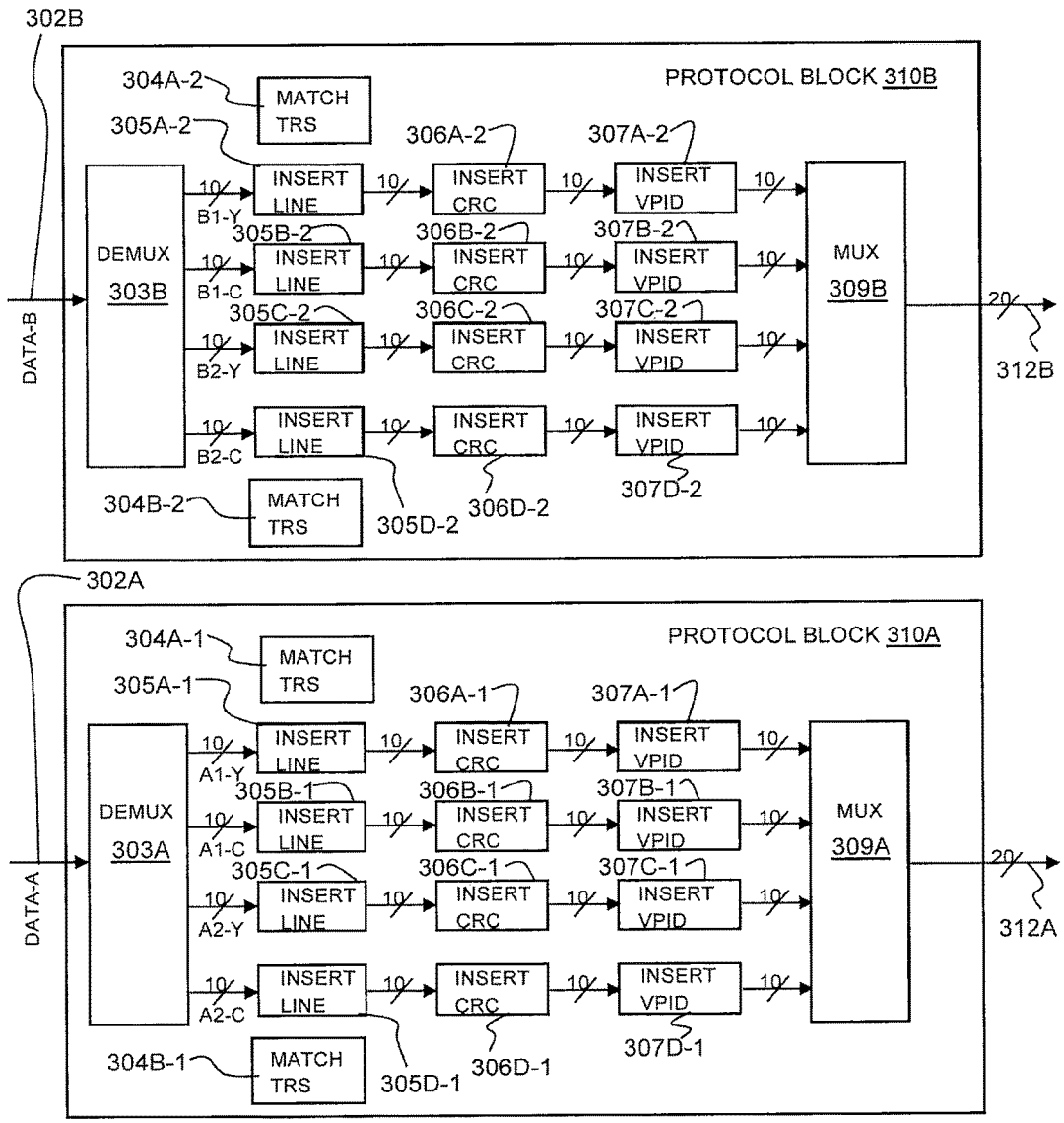

FIG. 3C shows protocol blocks in transmitter circuit 300 and FIG. 3C-1 shows selected data paths or logic blocks in protocol blocks 310A and 310B that are enabled when transmitting a 4K video stream at either 5.94 or 5.934 Gbps. As is generally known, a 4K video stream or a 4K image may be mapped onto four sub-images. As an example, a 4K image may be split into four sub-images using a two-sample interleave division or a square division. Each sub-image is then mapped to multiple 10-bit basic data streams in accordance with pre-defined virtual interface mapping structures. Specific details of the 4K standard (e.g., mapping structures, etc.) are not described herein in order to not unnecessarily obscure the present invention.

In the embodiment of FIG. 3C, when transmitting a 4K video stream, protocol blocks 310A and 310B are enabled while protocol blocks 310C and 310D are disabled. Accordingly, input terminal 302A associated with data stream DATA-A and input terminal 302B associated with data stream DATA-B are enabled while other input terminals 302C and 302D that are associated with data streams DATA-C and DATA-D, respectively, may be disabled. A 40-bit data stream (i.e., a 5.94 or 5.934 Gbps 4K video stream) may be transmitted from input terminals 302A and 302B to protocol blocks 310A and 310B respectively.

Referring next to FIG. 3C-1, demultiplexing circuits 303A and 303B in the respective protocol blocks 310A and 310B may split the respective data streams DATA-A and DATA-B received at terminals 302A and 302B, respectively, into 10-bit basic data streams for further processing. Data streams A1-Y and A1-C carry the luminance and chrominance components, respectively, of a first sub-image of the 4K video stream while A2-Y and A2-C carry the luminance and chrominance components, respectively, of a second sub-image of the 4K video stream. Accordingly, data streams B1-Y and B1-C represent a third sub-image and data streams B2-Y and B2-C represent a fourth sub-image of the 4K video stream.

As shown in FIG. 3C-1, when processing or transmitting a 4K video stream at 5.94 or 5.934 Gbps, every data path or logic block (e.g., match TRS blocks 304A-1 and 304B-2, and 304A-2 and 304B-2; insert line blocks 305A-1-305D-1, and 305A-2-305D-2; insert CRC blocks 306A-1-306D-1, and 306A-2-306D-2; and insert VPID blocks 307A-1-307D-1, and 307A-2-307D-2) within protocol blocks 310A and 310B may be enabled. After the respective data streams have been processed by the various blocks within protocol blocks 310A and 310B multiplexing circuits 309A and 309B may combine the respective 10-bit basic streams to output two 20-bit video streams at output terminals 312A and 312B, respectively. In other words, protocol blocks 310A and 310B may collectively output a 40-bit data stream similar to the format of the received 4K video stream.

Referring back to FIG. 3C, the 40-bit video stream is then transmitted to scrambler circuit 320. As shown in FIG. 3C, scrambler circuit 320 receives two 20-bit video streams from the respective output terminals 312A and 312B of protocol blocks 310A and 310B. In one scenario, transmitter circuit 300 may operate at a constant clock rate (e.g., 148.5 MHz or 148.35 MHz). Accordingly, when transmitter circuit 300 is a transmitting 4K video stream at either 5.94 or 5.934 Gbps (commonly referred to as 6G), clock enable circuit 340 may generate a static enable signal or DATA-VALID signal that is transmitted to protocol blocks 310A and 310B, scrambler circuit 320, and oversampler circuit 330.

As shown in FIG. 3C, the input and output data widths of scrambler circuit 320 may be set to 40 bits respectively when transmitter circuit 300 is transmitting a 6G 4K data stream. The 40-bit data output from scrambler circuit 320 is transmitted, via a pair of 20-bit output terminals 322A and 322B, to oversampler circuit 330. Oversampler circuit 330 may oversample the 40-bit data output from scrambler circuit 320 by two times (assuming transmitter circuit 300 is configured to operate at a default data rate of 11.88 Gbps or 11.868 Gbps). The oversampled 80-bit data output TX-DATA-SAMPLED from oversampler circuit 330 may then be serialized by serializer 370. The serialized output TX-DATA-OUTPUT is then transmitted out of transmitter circuit 300 via output terminal 372. As mentioned above with reference to FIG. 3B, the different data rates for the 4K video stream (e.g., 5.94 or 5.934 Gbps) may represent different video standards, such as PAL and NTSC. Accordingly, reconfiguration controller circuit 360 may selectively reconfigure serializer circuit 370, at runtime, to operate at different clock rates based on the selected video standard.

Figure 3D:
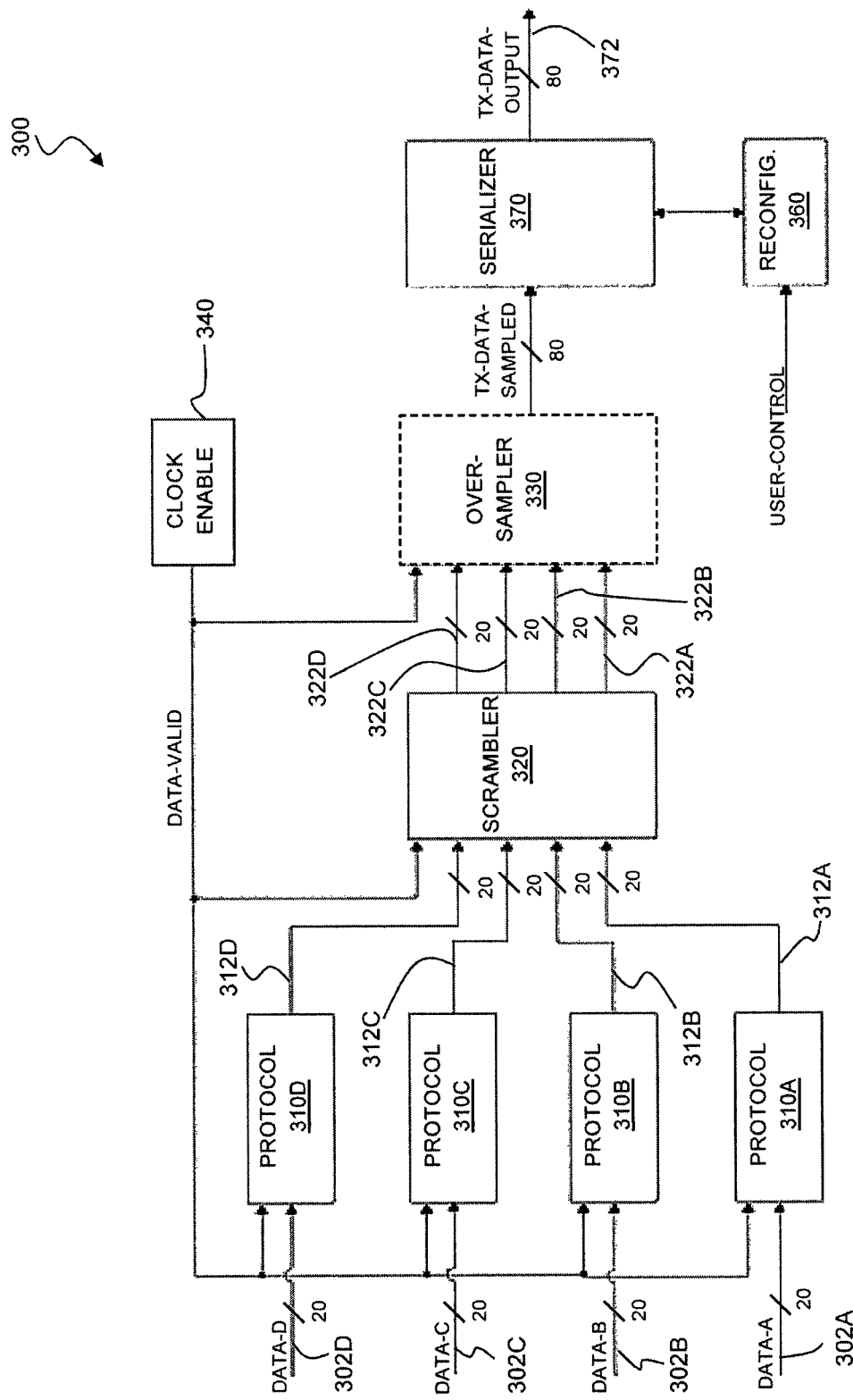
Figures 1, 3D:
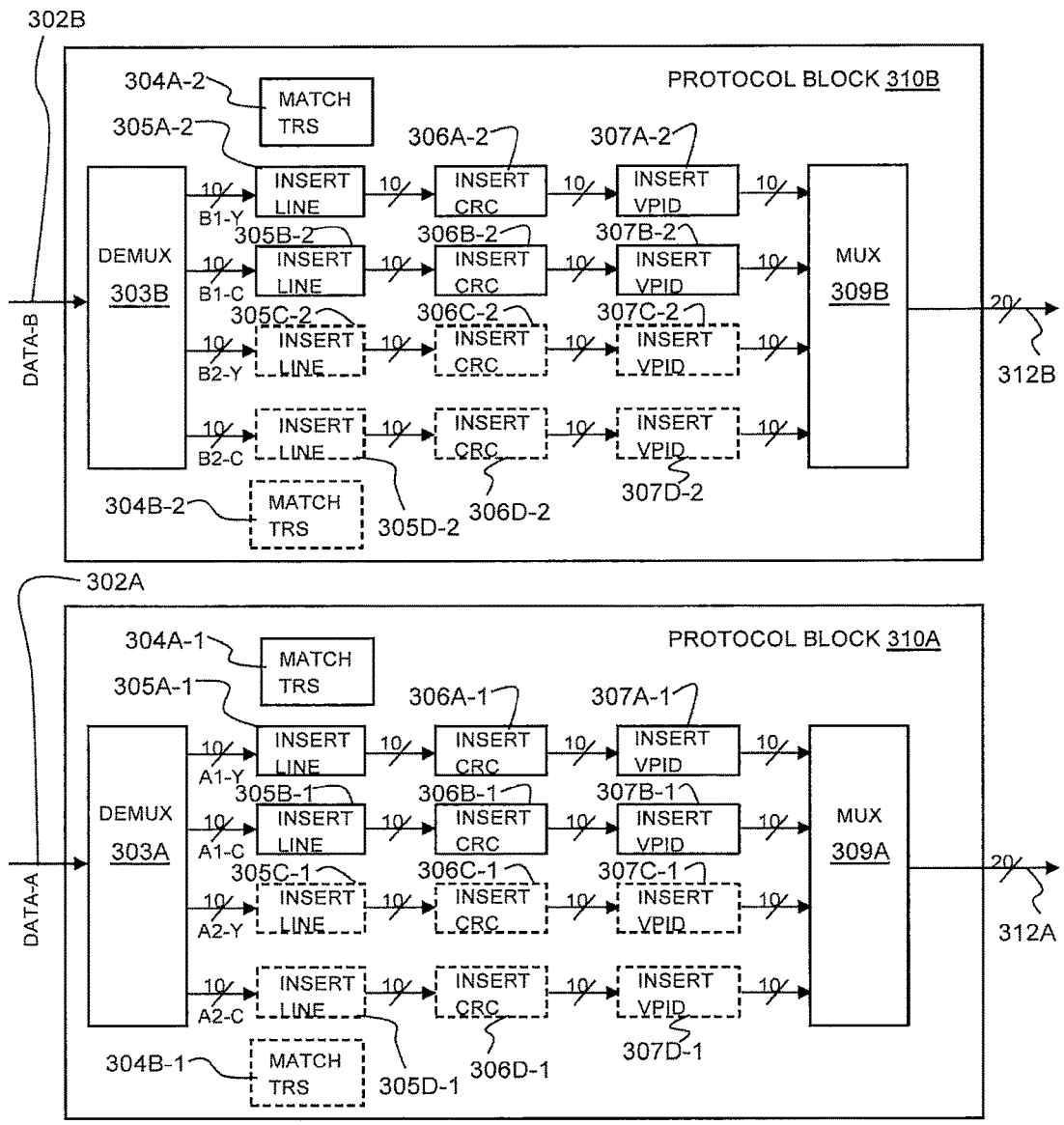
Figures 2, 3D:
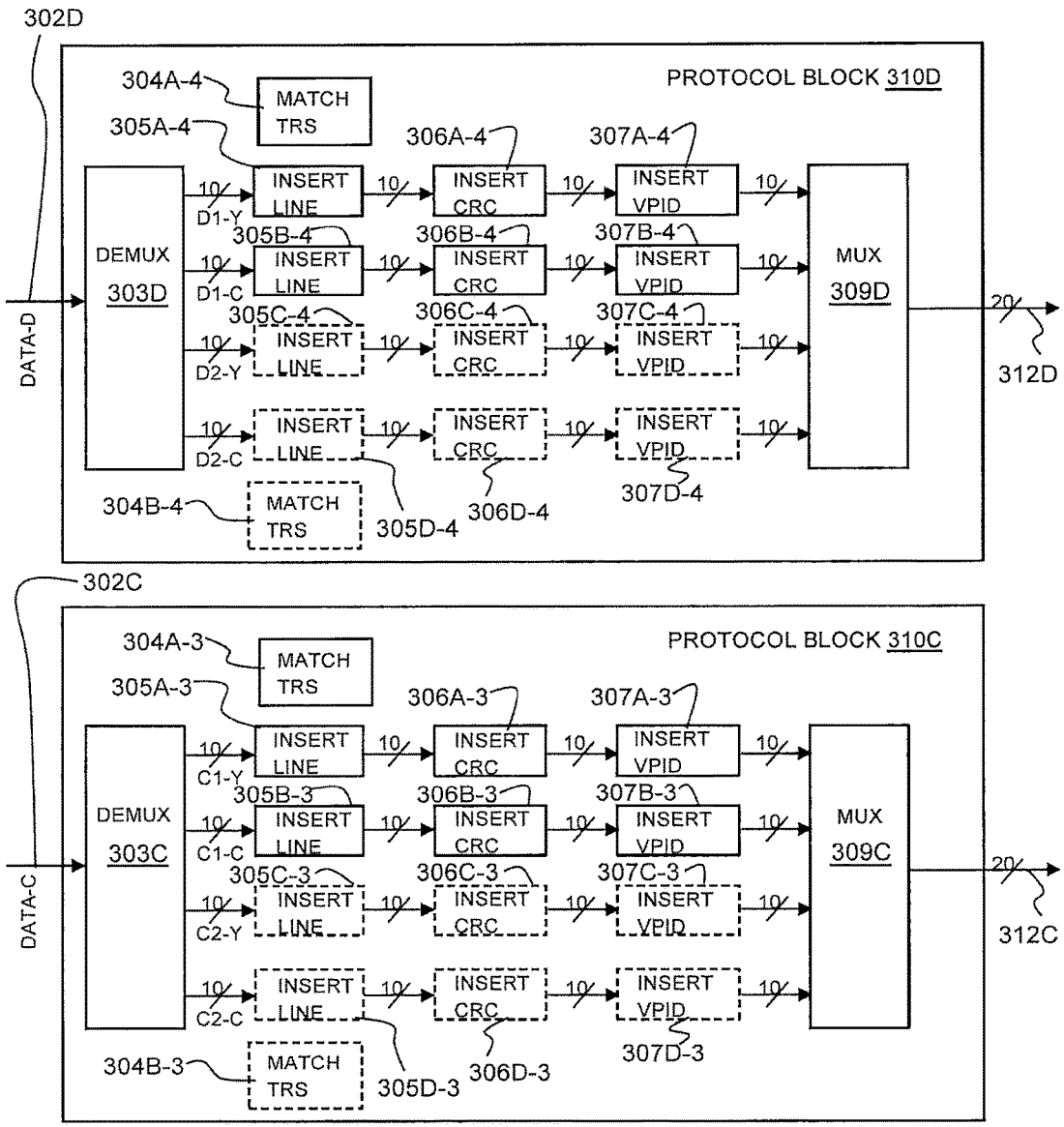

FIG. 3D shows protocol blocks in transmitter circuit 300 and FIGS. 3D-1 and 3D-2 show selected data paths or logic blocks in protocol blocks 310A-310D that are enabled and disabled when transmitting a 4K video stream at either 11.88 or 11.868 Gbps. When transmitting a 4K video stream at 11.88 or 11.868 Gbps (commonly referred to as a 12G data stream), protocol blocks 310A-310D are enabled (even though selected blocks within the respective protocol blocks 310A-310D may be disabled). An 80-bit data stream (i.e., a 4K video stream with a data rate of 11.88 or 11.868 Gbps) is transmitted via input terminals 302A-302D.

As mentioned above, a 4K video stream may be mapped onto four sub-images. Accordingly, input terminals 302A-302D associated with data streams DATA-A, DATA-B, DATA-C, and DATA-D, respectively, are enabled. An 80-bit data stream may thus be transmitted from input terminals 302A-302D to protocol blocks 310A-310D respectively.

Referring to FIG. 3D-1, data stream A1 (A1-Y and A1-C) in protocol block 310A may carry the first sub-image of the 4K video stream while data stream B1 (B1-Y and B1-C) in protocol block 310B may carry the second sub-image of the 4K video stream. Referring next to FIG. 3D-2, data stream C1 (C1-Y and C1-C) in protocol block 310C and data stream D1 (D1-Y and D1-C) in protocol block 310D may carry the third and fourth sub-images respectively.

Demultiplexing circuits 303A-303D and multiplexing circuits 309A-309D in the respective protocol blocks 310A-310D, as shown in respective FIGS. 3D-1 and 3D-2, may be disabled as 20-bit data streams are transmitted concurrently to the respective protocol blocks 310A-310D. Each of the protocol blocks 310A-310D may process a 20-bit data stream that represents a corresponding sub-image of the 80-bit 4K video stream. In one scenario, only the data paths (and the logic blocks) associated with data streams A1, B1, C1 and D1 in the respective protocol blocks 310A-310D may be enabled. Other data paths or logic blocks in the protocol blocks 310A-310D that are not associated with the respective data streams A1, B1, C1 and D1 may be disabled.

As shown in FIG. 3D-1, match TRS block 304A-1, insert line blocks 305A-1-305B-1, insert CRC blocks 306A-1-306B-1 and insert VPID blocks 307A-1-307B-1 are enabled while other logic blocks in protocol block 310A are disabled (disabled logic blocks are represented by dotted lines). Accordingly, match TRS block 304A-2, insert line blocks 305A-2-305B-2, insert CRC blocks 306A-2-306B-2 and insert VPID blocks 307A-2-307B-2 are enabled while other logic blocks in protocol block 310B are disabled. Similarly, as shown in FIG. 3D-2, match TRS block 304A-3, insert line blocks 305A-3-305B-3, insert CRC blocks 306A-3-306B-3 and insert VPID blocks 307A-3-307B-3 are enabled while other logic blocks in protocol block 310C are disabled. In protocol block 310D, match TRS block 304A-4, insert line blocks 305A-4-305B-4, insert CRC blocks 306A-4-306B-4 and insert VPID blocks 307A-4-307B-4 are enabled while other logic blocks are disabled (again, disabled logic blocks are represented by dotted lines).

Referring back to FIG. 3D, after the respective data streams have been processed by the various logic blocks within protocol blocks 310A, 310B, 310C and 310D, the four 20-bit data streams are then transmitted to scrambler circuit 320 via output terminals 312A, 312B, 312C, and 312D, respectively. As shown in FIG. 3D, the input and output data widths of scrambler circuit 320 may be set to 80 bits respectively when transmitter circuit 300 is transmitting a 12G 4K data stream. The 80-bit data output from scrambler circuit 320 is transmitted to oversampler circuit 330 via output terminals 322A-322D. In one scenario, oversampler circuit 330 may be bypassed or disabled (i.e., no oversampling is needed or performed) as transmitter circuit 300 is configured to operate at a default data rate of 11.88 Gbps or 11.868 Gbps. As such, the 80-bit data output from scrambler circuit 320 may be transmitted directly to serializer 370 via oversampler circuit 330.

In one embodiment, transmitter circuit 300 may operate at a constant clock rate (e.g., 148.5 MHz or 148.35 MHz). Accordingly, when transmitter circuit 300 is transmitting a 12G 4K video stream at either 11.88 or 11.868 Gbps (the different data rates may represent different video standards such as PAL and NTSC), clock enable circuit 340 may generate an asserted enable signal or DATA-VALID signal that is transmitted to protocol blocks 310A-310D, scrambler circuit 320, and oversampler circuit 330.

It should be noted that even though only four protocol blocks are shown in the embodiments of FIGS. 2A, and 3A-3D, more (or even fewer) protocol blocks may be used in this context. When more protocol blocks are used, the transmitter circuit may potentially support data streams with higher resolutions (4K, 8K and beyond). In one scenario, the transmitter circuit may operate at a constant reference clock irrespective of the data rate of the data stream being transmitted and irrespective of the number of protocol blocks used. In this scenario, a clock enable circuit similar to clock enable circuit 240 of FIG. 2A may be used to generate a DATA-VALID signal based on the data rate being transmitted without changing the frequency of the reference clock signal.

FIG. 4A shows illustrative multi-rate receiver circuit 400 in accordance with embodiments of the present invention. Receiver circuit 400 includes four protocol blocks 410A-410D, TRS aligner circuit 415, descrambler circuit 420, oversampler circuit 430, deserializer 470, reconfiguration controller circuit 460, video standard detector 480, state machine circuit 490, and rate detector 495. Receiver circuit 400 may receive video streams at different data rates and resolutions. In one scenario, receiver circuit 400 may receive video streams with data rates ranging from 270 Mbps to 11.88 Gbps.

In the embodiment of FIG. 4A, receiver circuit 400 may be part of a transceiver circuit in an IC device similar to IC 100. Accordingly, receiver circuit 400 may receive data streams RX-DATA-INPUT at input terminal 468 and may convey processed data streams DATA-OUT-A, DATA-OUT-B, DATA-OUT-C, and DATA-OUT-D to the core region (e.g., core region 115) of the IC device via output terminals 412A, 412B, 412C and 412D, respectively. Each of the output terminals 412A-412D may be a 20-bit output terminal. Depending on the data streams received, a portion of the protocol blocks 410A-410D may be enabled or disabled. (Specific details of protocol blocks 410A-410D and how they may be enabled and disabled based on the data rate of the received data stream RX-DATA-INPUT will be explained later with reference to FIG. 4B, FIGS. 5A-5D, and FIGS. 5A-1-5D-1 and 5D-2.)

In one scenario, receiver circuit 400 may be set or configured to operate at 12G (e.g., either 11.88 Gbps or 11.868 Gbps). In this scenario, deserializer 470 may receive an 80-bit data stream RX-DATA-INPUT from an external element (not shown) at input terminal 468. The received 80-bit data or video stream RX-DATA-INPUT may be split into four 20-bit output streams and transmitted to oversampler circuit 430. In one embodiment, deserializer 470 may have an adjustable data width and as such, its output data width may be adjusted accordingly based on the data rate associated with the received data stream RX-DATA-INPUT.

Video standard detector 480 may perform a gross rate detection operation on the incoming video stream by looking at the edge density of the video stream or the number of transitions in the video stream. Video streams with different data rates may have a different number of transitions due to the scrambling algorithm specified by different input-output standards. As an example, an 11.88 Gbps video stream may have N number of transitions (with N being a positive number greater than 0) and a 5.94 Gbps video stream may have N/2 (11.88/2=5.94) number of transitions. Accordingly, a 2.97 Gbps video stream may have N/4 (11.88/4=2.97) number of transitions, a 1.485 Gbps video stream may have N/8 (11.88/8=1.485) number of transitions, and so on.

In one embodiment, receiver circuit 400 may operate at a constant clock rate (e.g., 148.5 MHz or 148.5/1.001 MHz, depending on the video standard). In this embodiment, receiver circuit 400 (or more specifically, deserializer 470 may be reconfigured during runtime based on the data rate associated with the received data stream RX-DATA-INPUT. For example, state machine circuit 490 may receive the data rate determined by video standard detector 480 and may accordingly initiate a reconfiguration of deserializer 470 via reconfiguration controller circuit 460 based on the data rate of the data stream. It should be noted that specific reconfiguration operations and logic elements (e.g., clock and data recovery (CDR) circuitry, etc.) that may be involved in such operations are not shown or described in detail herein in order to not unnecessarily obscure the present invention. In one scenario, rate detector 495 may detect the recovered clock rate of the received data stream based on the RECOVERED-CLOCK signal obtained from the CDR circuitry (not shown) in serializer 470. In this scenario, receiver circuit 400 may determine the frequency of the received data stream and subsequently its associated video standard (e.g., either PAL or NTSC) based on the VIDEO-RATE output at output terminal 497 of rate detector 495.

After the received data stream RX-DATA-INPUT has been deserialized by deserializer 470, four parallel 20-bit data streams may be transmitted to oversampler circuit 430. The received data stream RX-DATA-INPUT may be an oversampled data stream that has been oversampled by a predetermined factor (e.g., data stream TX-DATA-OUTPUT 372 of FIG. 3A). Oversampler circuit 430 may operate on the lowest 20 bits of the received data stream RX-DATA-INPUT and may accordingly extract data from the oversampled incoming data stream.

In one scenario, receiver circuit 400 may be reconfigurable such that the RECOVERED-CLOCK may be configured dynamically during runtime according to the data rate of the received data stream RX-DATA-INPUT. For example, the RECOVERED-CLOCK may be set to 148.5 MHz when RX-DATA-INPUT is either an SD, 3G, 6G or 12G data stream. Alternatively, the RECOVERED-CLOCK may be set to 148.35 MHz when RX-DATA-INPUT is either a 3G, 6G or 12G data stream. When RX-DATA-INPUT is a 1.485 or 1.4385 Gbps HD data stream, RECOVERED-CLOCK may be set to 74.25 or 74.175 MHz. In this scenario, when receiver circuit 400 receives a 3G, 6G, 12G, or an HD data or video stream, oversampler circuit 430 may be bypassed (i.e., the data stream is not oversampled). When receiver circuit 400 receives a 270 Mbps SD data stream the data stream may be oversampled eleven times (270 Mbps× 11=2.97 Gbps, which is equivalent to a 3G video stream at 148.5 MHz).

The data streams may then be transmitted from oversampler circuit 430 to descrambler circuit 420. In one embodiment, scrambler circuit 420 may operate on 10, 20, 40 and 80 bits of data stream for SD, HD/3G, 6G and 12G data streams respectively. The number of bits may be determined based on the data rate of the received data stream RX-DATA-INPUT (as determined by video standard detector 480). Descrambler circuit 430 may then perform data descrambling on the parallel data streams. In one scenario, descrambling circuit 430 may reverse prior scrambling applied to the data stream (by a scrambler circuit such as scrambler circuit 220 in transmitter circuit 200 of FIG. 2A) by using a linear feedback shift register (LFSR) and implementing the NRZI modulation scheme on the received data stream.

The descrambled parallel data streams are then transmitted to TRS aligner circuit 415. Based on the data rate and the number of bits of the received data stream, TRS aligner circuit 415 may align the parallel data streams based on a predefined pattern in the parallel data streams. The aligned parallel data streams may then be transmitted to the respective protocol blocks 410A-410D for further processing. The respective output terminals 412A-412D of protocol blocks 410A-410D may convey the data streams DATA-OUT-A, DATA-OUT-B, DATA-OUT-C, and DATA-OUT-D to other circuitry (e.g., other logic blocks in an IC device) via respective output terminals 412A-412D. In one embodiment, depending on the data rate of the received data stream, zero or more portions of the protocol blocks 410A-410D may be enabled or disabled.

FIG. 4B shows a more detailed representation of a protocol block in a receiver circuit in accordance with embodiments of the present invention. As an example, protocol block 410 may be any one of protocol blocks 410A-410D described above with reference to FIG. 4A. Protocol block 410 may be used to implement an SDI standard. Accordingly, protocol block 410 includes demultiplexing circuit 402, match TRS blocks 403A and 403B, extract line blocks 404A and 404B, check CRC blocks 405A-405D, extract VPID blocks 406A and 406B, and detect format block 407. As shown in FIG. 4A, each of the protocol blocks 410A-410D may receive a 20-bit data stream. Accordingly, protocol block 410 in FIG. 4B may receive a 20-bit data stream at input terminal 401 from TRS aligner circuit 415 of FIG. 4A.

Demultiplexing circuit 402 may split the 20-bit data stream into four parallel 10-bit data streams that represent different components of the received data or video stream. Match TRS blocks 403A and 403B may align the descrambled received data stream by matching a selected pattern in the descrambled data stream. As an example, match TRS blocks 403A and 403B may raise a flag or assert a signal to indicate a matched alignment. As described above with reference to FIG. 2B, an insert line block (either one of 205A-205D) may include a line number into the transmitted video stream. Accordingly, extract line blocks 404A and 404B may decode appropriate data words to extract the line number of a received video stream.

In some instances, protocol block 410 may perform CRC checking on the respective 10-bit data streams with check CRC blocks 405A-405D. Check CRC blocks 405A-405D may be disabled, bypassed, or omitted if CRC error checking is disabled or not required. Extract VPID blocks 406A and 406B may then extract VPID packets present in the data stream. In the example of FIG. 4B, two extract VPID blocks 406A and 406B are used to detect VPID packets in the 10-bit Y component of the data streams D1-Y and D2-Y.

Detect format block 407 may monitor the line and frame timing of the incoming video stream and may generate various flags or signals to indicate whether the received video stream is stable. It should be noted that protocol block 410 and the logic blocks within it are shown mainly to illustrate the different paths that may be associated with different data streams and as such, well-known operations of the respective logic blocks or submodules shown in protocol block 410 are not described in detail in order to not unnecessarily obscure the present invention. In some scenarios, depending on the resolution and data rate of the received data stream, selected data paths and specific logic blocks along the data paths may be enabled and disabled during runtime.

FIGS. 5A-5D show receiver circuit 500 with selected protocol blocks (and FIGS. 5A-1-FIG. 5D-1 and 5D-2 show individual logic blocks within the selected protocol blocks) that are enabled and disabled based on the type of data stream received in accordance with embodiments of the present invention. It should be noted that receiver circuit 500 shown in FIGS. 5A-5D shares similarities with receiver circuit 400 of FIG. 4A and protocol blocks shown in FIGS. 5A-1-5D-1 and 5D-2 share similarities with protocol block 410 of FIG. 4B. As such, similar circuit elements or features shown in FIGS. 5A-5D and FIGS. 5A-1-5D-1 and 5D-2 share the same reference numerals, incremented by 100, with those shown in respective FIGS. 4A and 4B.

Figure 5A:
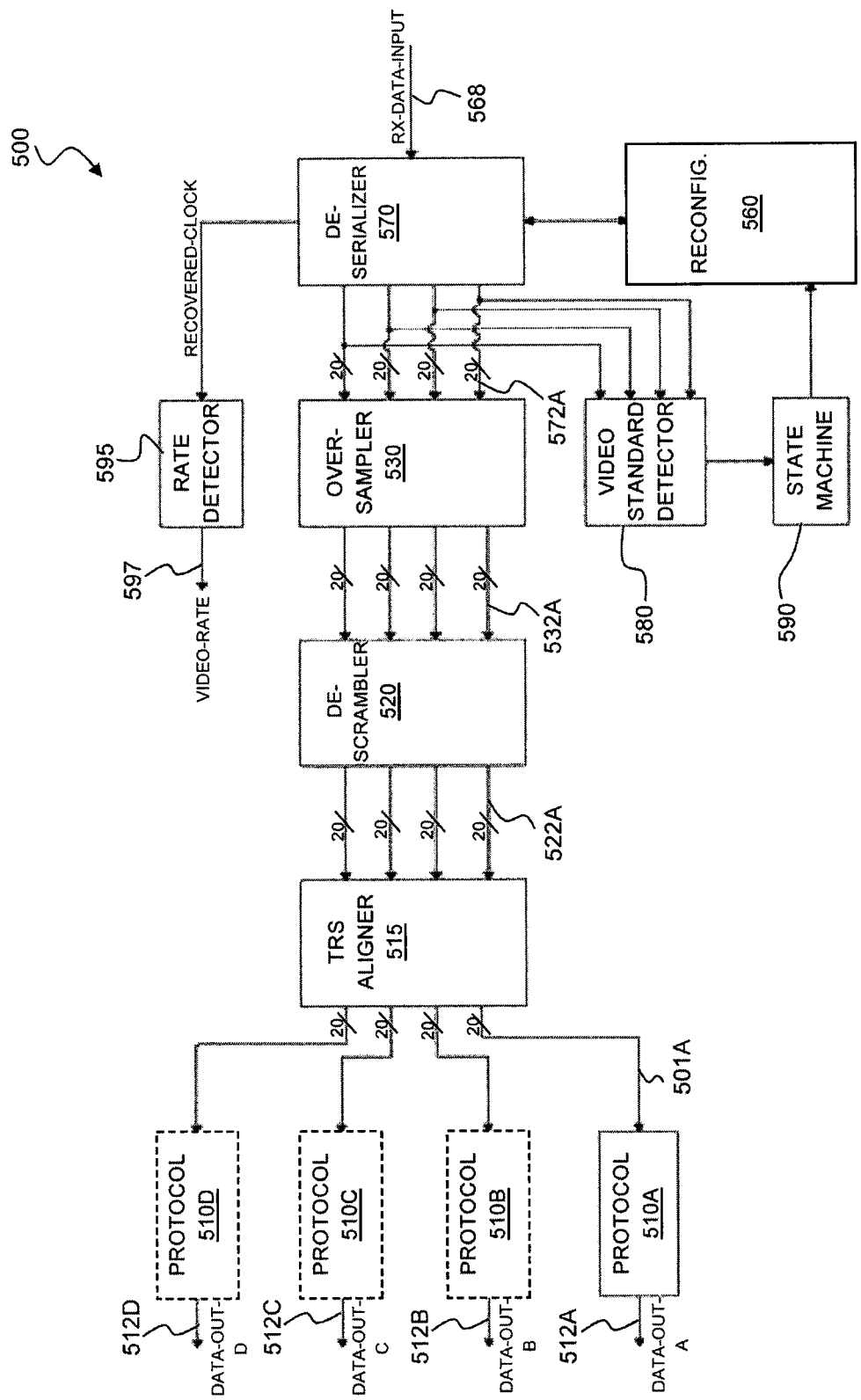
Figures 1, 5A:
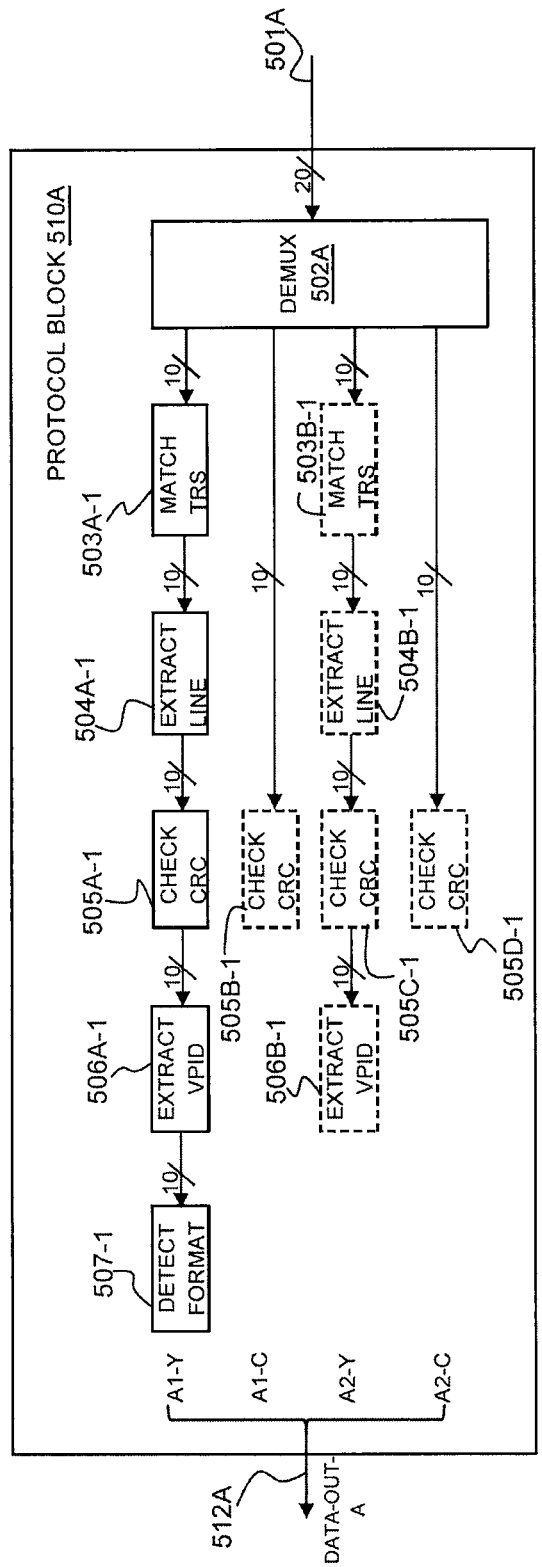

FIG. 5A shows protocol blocks in transmitter circuit 500 and FIG. 5A-1 shows selected data paths or logic blocks within protocol block 510A that are disabled when a 270 Mbps SD video stream RX-DATA-INPUT is received. As explained above with reference to FIG. 4A, reconfiguration controller circuit 460 may dynamically reconfigure receiver circuit 400 based on the data rate or video standard of the received video stream. Accordingly, when an SD video stream RX-DATA-INPUT is received at input terminal 568, receiver circuit 500 may be dynamically reconfigured by reconfiguration controller circuit 560 to operate with a 20-bit wide interface and a 148.5 MHz RECOVERED-CLOCK signal.

In one embodiment, oversampler circuit 530 may receive the lowest 20 bits of the output 572A from deserializer 570. In one scenario, receiver circuit 500 may be configured by reconfiguration controller circuit 560 to generate a 148.5 MHz recovered clock signal. (As mentioned above, rate detector 595 may determine the VIDEO-RATE of the received video stream based on the frequency of the RECOVERED-CLOCK signal). In this scenario, the received 270 Mbps SD data stream may be oversampled 11 times (270 Mbps×11=2.97 Gbps, which is equivalent to a 3G data stream using a 148.5 MHz recovered clock) by oversampler circuit 530. As an example, each bit of the data stream may be repeated 11 times. The data stream may then be transmitted via output terminal 532A to descrambler circuit 520 which may descramble the data stream based on different descrambling specifications as described above.

Accordingly, TRS aligner circuit 515 may align the descrambled data stream that is received from output terminal 522A of descrambler circuit 520 before transmitting the aligned data stream to input terminal 501A of protocol block 510A. In the embodiment of FIG. 5A, as receiver circuit 500 has been configured to operate at a data width of 20 bits, protocol blocks 510B-510D may be disabled. As shown in FIG. 5A, only protocol block 510A that is associated with data stream DATA-OUT-A may be enabled.

Referring next to FIG. 5A-1, demultiplexing circuit 502A in protocol block 510A may accordingly split the received video stream into 10-bit basic streams. The respective logic blocks (e.g., match TRS block 503A-1, extract line block 504A-1, check CRC block 505A-1, extract VPID block 506A-1 and detect format block 507-1) associated with data stream A1-Y in protocol block 510A are enabled. Other logic blocks (e.g., match TRS block 503B-1, extract line block 504B-1, check CRC blocks 505B-1-505D-1, and extract VPID block 506B-1) associated with the respective streams A1-C, A2-Y and A2-C may be disabled (logic blocks that are disabled are represented with dotted lines). Data stream A1-Y may then be transmitted as DATA-OUT-A via output terminal 512A to other circuitry (not shown) or other parts of the IC device (assuming receiver circuit 500 of FIG. 5A is a circuit in an IC device).

Figure 5B:
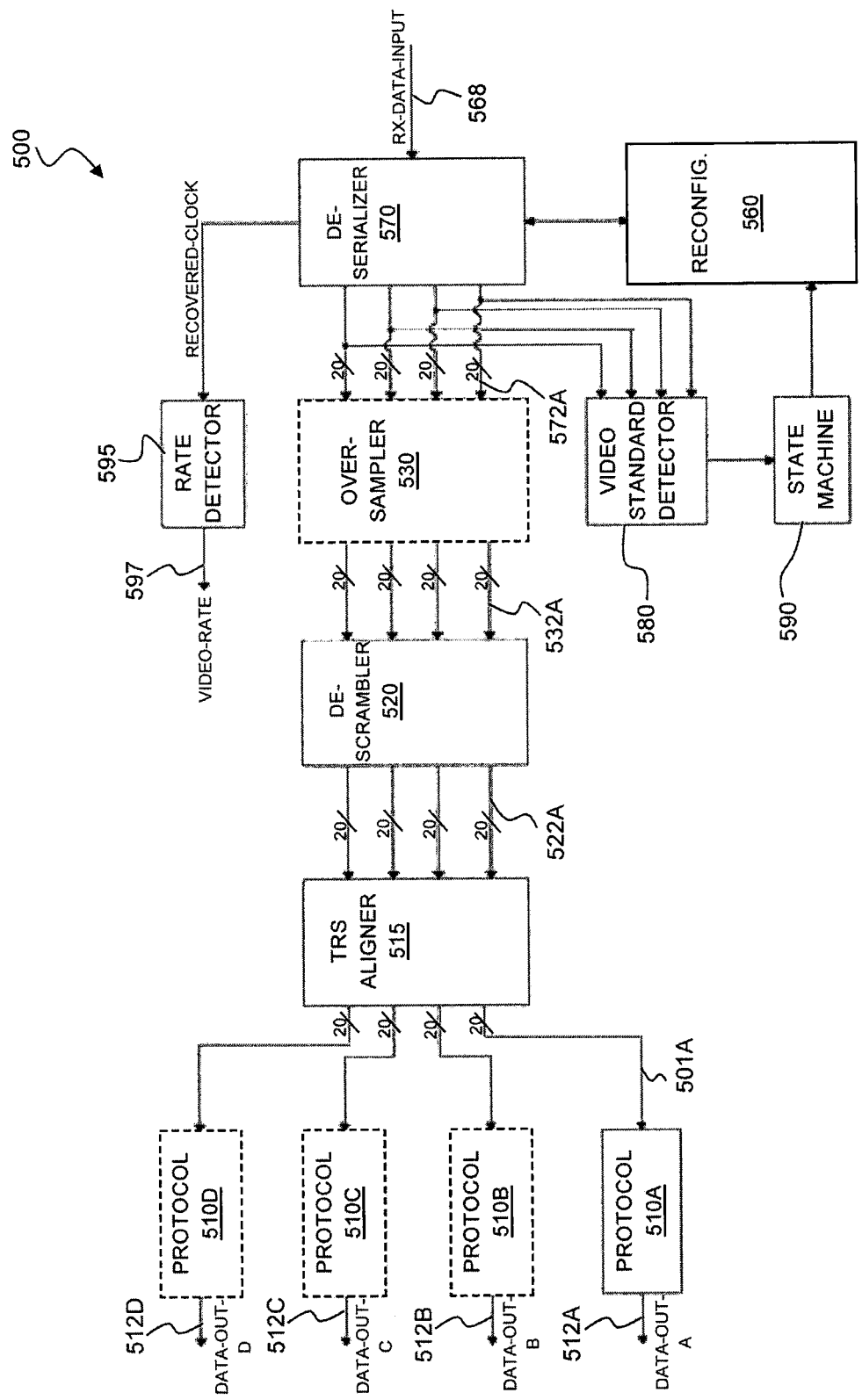
Figures 1, 5B:
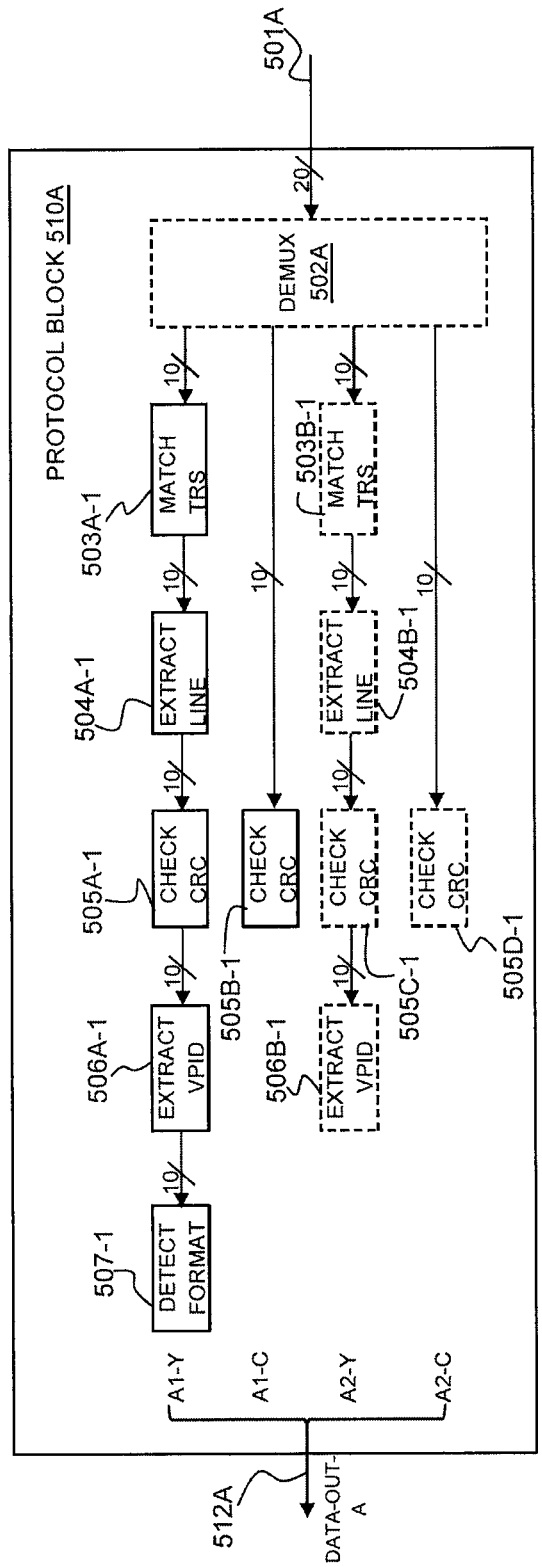

FIG. 5B shows selected protocol blocks in receiver circuit 500 and FIG. 5B-1 shows logic blocks in the selected protocol blocks that are enabled when receiving a high definition (HD) video stream (e.g., a 1.485 (or 1.4835) or a 2.97 (or 2.967) Gbps HD video stream). When a 1.485 or 1.4835 Gbps HD video stream RX-DATA-INPUT is received at input terminal 568 of deserializer 570, receiver circuit 500 may be dynamically reconfigured to operate with a 20-bit interface and a 74.25 MHz (or 74.175 MHz, depending on the video standard) RECOVERED-CLOCK signal. When a 2.97 or 2.967 Gbps (3G) HD video stream RX-DATA-INPUT is received, receiver circuit 500 may be dynamically reconfigured to operate with a 20-bit interface and a 148.5 or 148.35 MHz RECOVERED-CLOCK signal. As mentioned above, the reconfiguration may be performed by reconfiguration controller 560 based on the data rate of the received data stream RX-DATA-INPUT. The data rate may be detected by video standard detector 580. In one scenario, as the RECOVERED-CLOCK signal is reconfigured dynamically based on the data rate of the received data stream RX-DATA-INPUT, oversampler circuit 530 may be bypassed (or no oversampling is performed on the received data stream).

Descrambler circuit 520 descrambles the 20-bit data stream received from output 532A based on different descrambling specifications as described above. Accordingly, TRS aligner circuit 515 may align the descrambled data stream received from output 522A of descrambler circuit 520 before transmitting the aligned data stream to input terminal 501A of protocol block 510A. In this instance, other protocol blocks 510B-510 may be disabled (disabled protocol blocks are shown with dotted lines).

Referring next to FIG. 5B-1, generally, an HD stream (either 1.485 or 1.4835 Gbps, or 2.97 or 2.967 Gbps) may be 20-bits wide with the upper 10 bits representing the luminance component and the lower 10 bits representing the chrominance component of the video stream. As such, in one scenario, demultiplexing circuit 502A in protocol block 510A may be disabled or bypassed. As an example, the upper 10 bits of the 20-bit data stream may be transmitted as a 10-bit data stream A1-Y directly to match TRS block 503A-1 and subsequent logic blocks along that data path (extract line block 504A-1, check CRC block 505A-1, extract VPID block 506A-1, and detect format block 507-1) and the lower 10 bits of the 20-bit data stream may be transmitted as a 10-bit data stream A1-C directly to check CRC block 505B-1.

Logic blocks associated with data stream A2-Y (match TRS block 503B-1, extract line block 504B-1, check CRC block 505C-1, and extract VPID block 506B-1) and data stream A2-C (check CRC block 505D-1) in protocol block 510A may be disabled. Data streams A1-Y and A1-C may be transmitted out of protocol block 510 as data stream DATA-OUT-A via output terminal 512A.

Figure 5C:
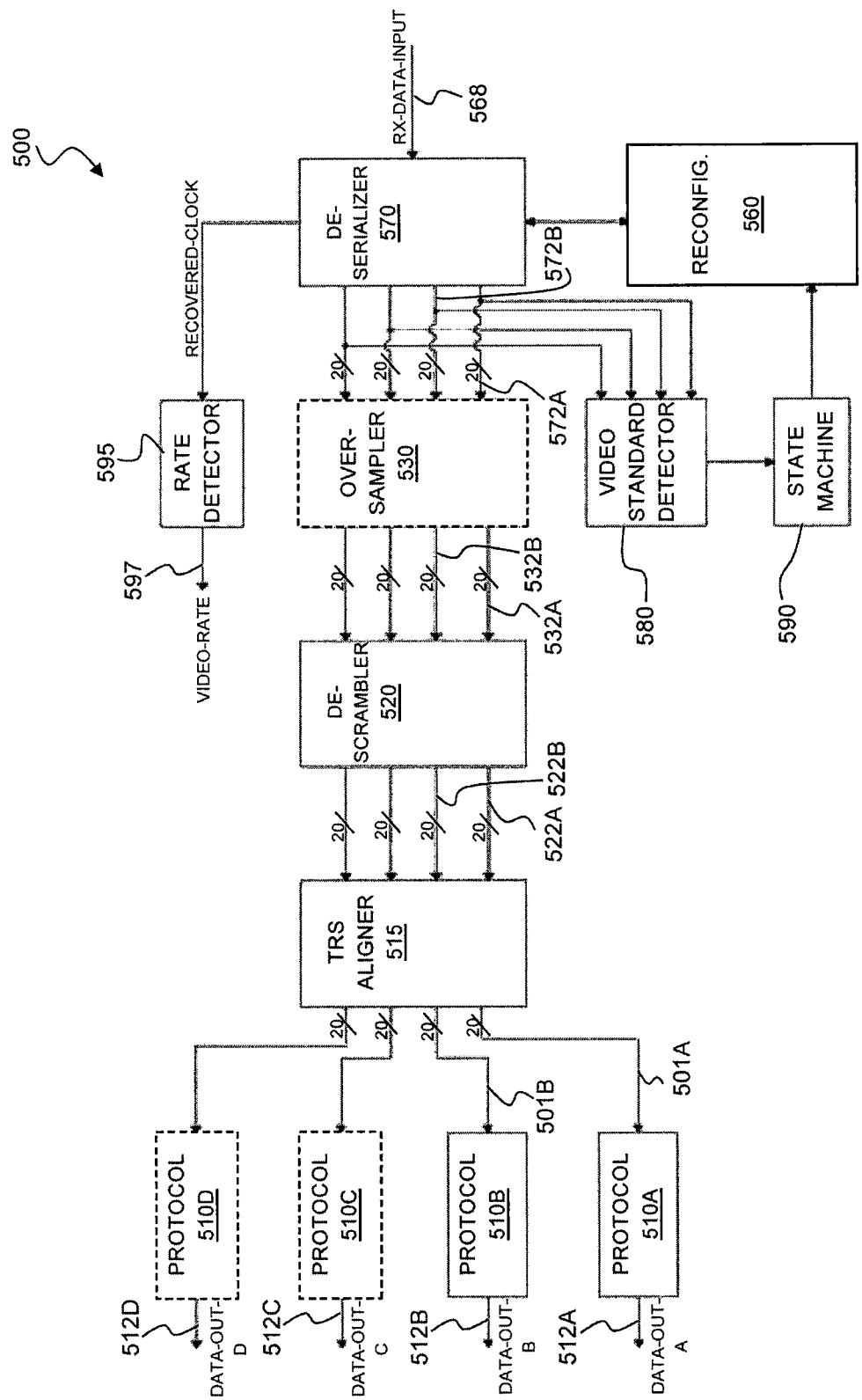
Figures 1, 5C:
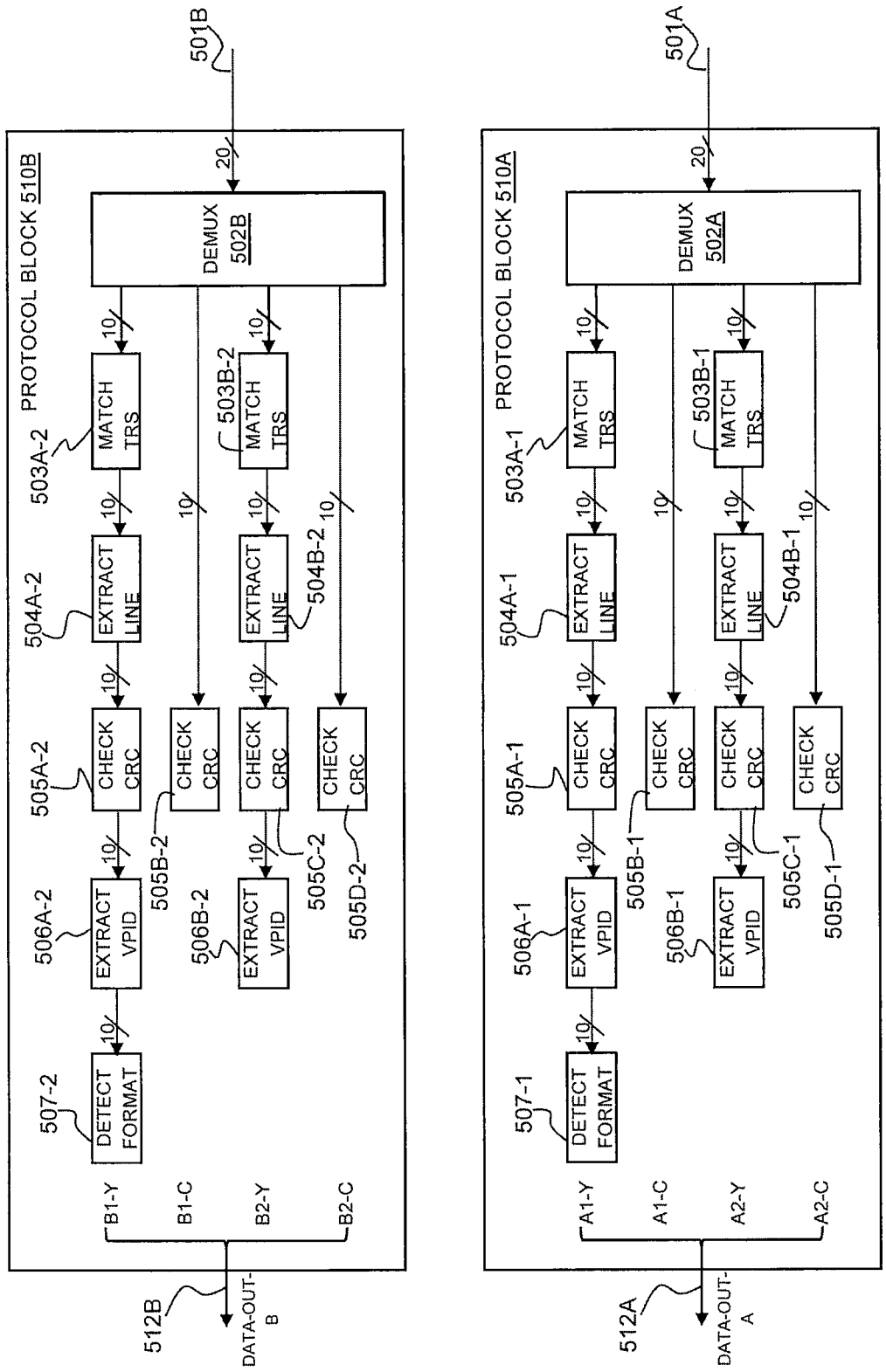

FIG. 5C shows protocol blocks in receiver circuit 500 and FIG. 5C-1 shows logic blocks in protocol blocks 510A and 510B that are enabled when a 5.94 or 5.934 Gbps 4K video stream is received. As is generally known, a 4K video stream or a 4K image may be mapped onto four sub-images. Each sub-image is then mapped onto multiple 10-bit basic data streams in accordance with pre-defined virtual interface mapping structures. When a 5.94 or 5.934 Gbps (6G) 4K video stream RX-DATA-INPUT is received at input 568 of deserializer 570, receiver circuit 500 may be dynamically reconfigured to operate with a 40-bit interface (i.e., output terminals 572A and 572B of deserializer circuit 370 are enabled or used) and a 148.5 or 148.35 MHz RECOVERED-CLOCK (depending on the video standard, PAL or NTSC, of the received video stream).

The reconfiguration may be performed by reconfiguration controller 560 based on the data rate of the received data stream RX-DATA-INPUT. In one scenario, as the RECOVERED-CLOCK signal is dynamically reconfigured, oversampler circuit 530 may be bypassed (or no oversampling is performed on the received data stream). Descrambler circuit 520 descrambles the 40-bit data stream (received as two 20-bit data streams from output terminals 532A and 532B respectively) while TRS aligner circuit 515 aligns the respective descrambled data streams from output terminals 522A and 522B before transmitting the aligned data streams to input terminals 501A and 502B of the respective protocol blocks 510A and 510B. As receiver circuit 500 is configured to operate with a 40-bit interface, protocol blocks 510C and 510D and their respective output terminals 512C and 512D may be disabled.

Referring next to FIG. 5C-1, demultiplexing circuits 502A and 502B may split the respective data streams received at input terminals 501A and 501B into 10-bit basic data streams for processing by the respective logic blocks within protocol blocks 510A and 510B. Accordingly, all the logic blocks along the respective data paths for data streams A1-Y and A1-C, A2-Y and A2-C, B1-Y and B1-C, and B2-Y and B2-C in protocol blocks 510A and 510B may be enabled. As shown in FIG. 5C-1, match TRS blocks 503A-1 and 503B-1, extract line blocks 504A-1 and 504B-1, check CRC blocks 505A-1-505D-1, extract VPID blocks 506A-1 and 506B-1, and detect format block 507-1 in protocol block 501A are enabled. Similarly, match TRS blocks 503A-2 and 503B-2, extract line blocks 504A-2 and 504B-2, check CRC blocks 505A-2-505D-2, extract VPID blocks 506A-2 and 506B-2, and detect format block 507-2 in protocol block 501B are enabled. Data streams A1-Y and A1-C carry the luminance and chrominance components, respectively, of a first sub-image of the 4K video stream while A2-Y and A2-C carry the luminance and chrominance components, respectively, of a second sub-image of the 4K video stream. Accordingly, data streams B1-Y and B1-C represent a third sub-image and data streams B2-Y and B2-C represent a fourth sub-image of the 4K video stream. The respective data streams are transmitted out of protocol blocks 510A and 510B as DATA-OUT-A and DATA-OUT-B via output terminals 512A and 512B.

Figure 5D:
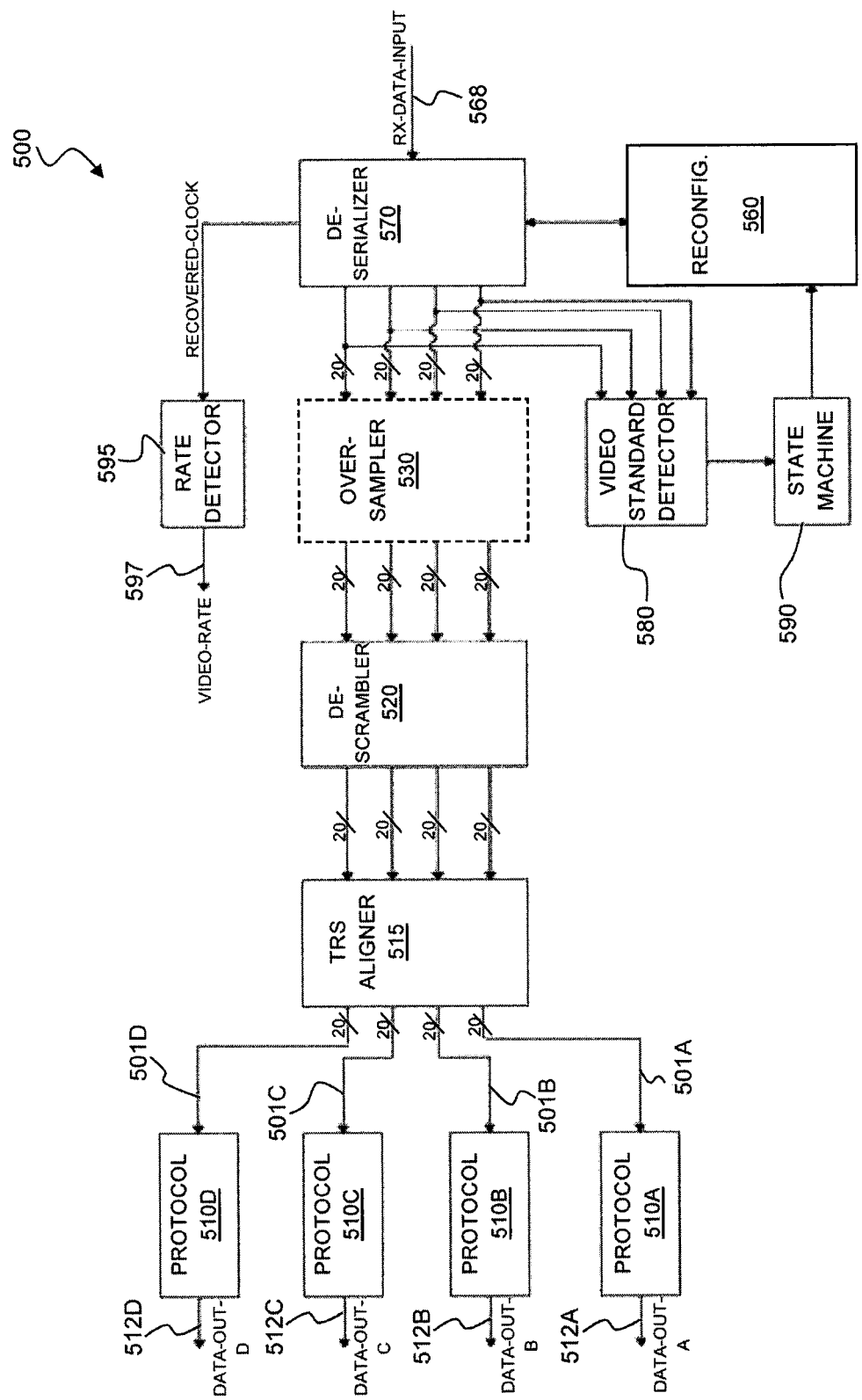
Figures 1, 5D:
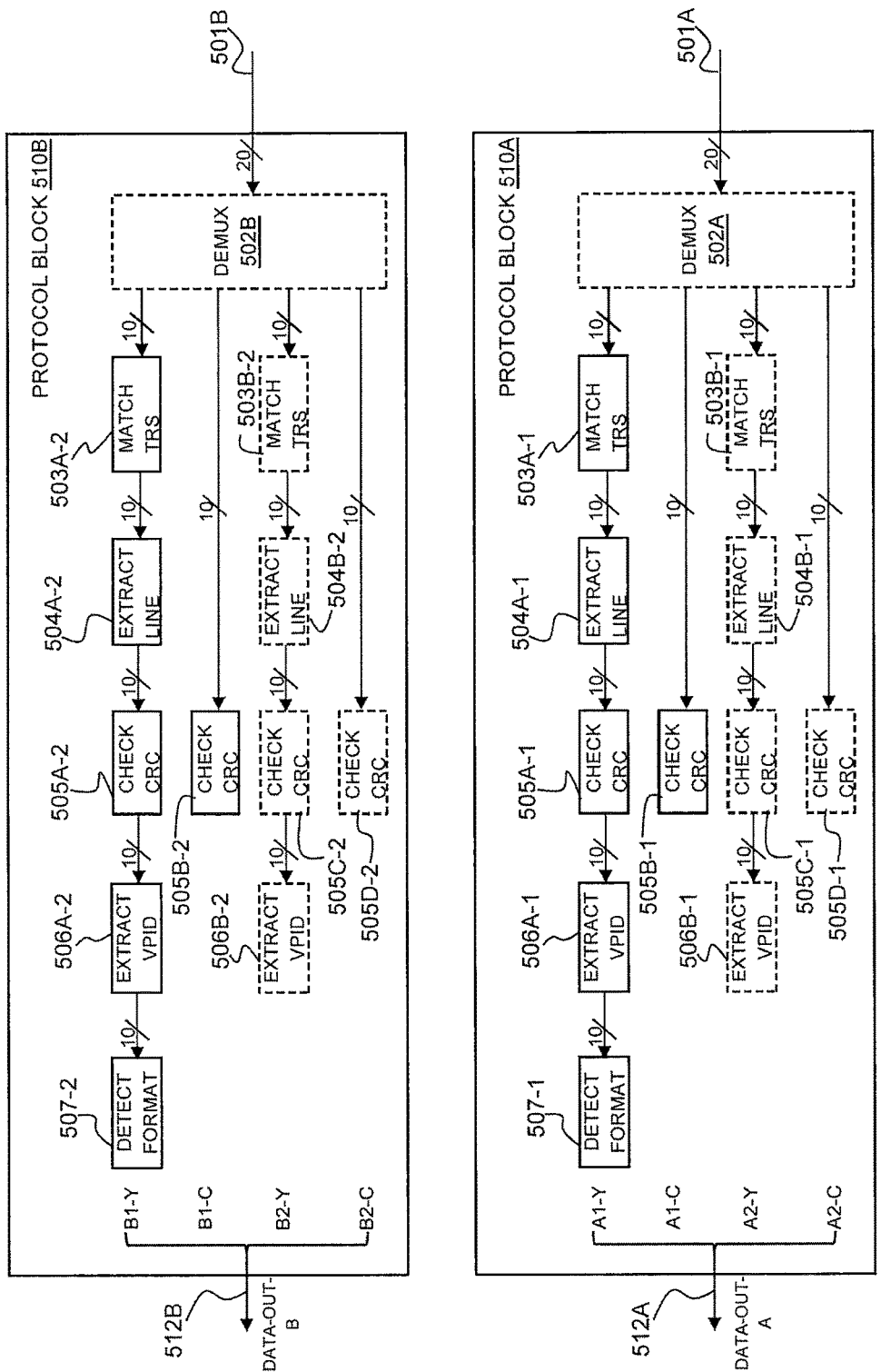
Figures 2, 5D:
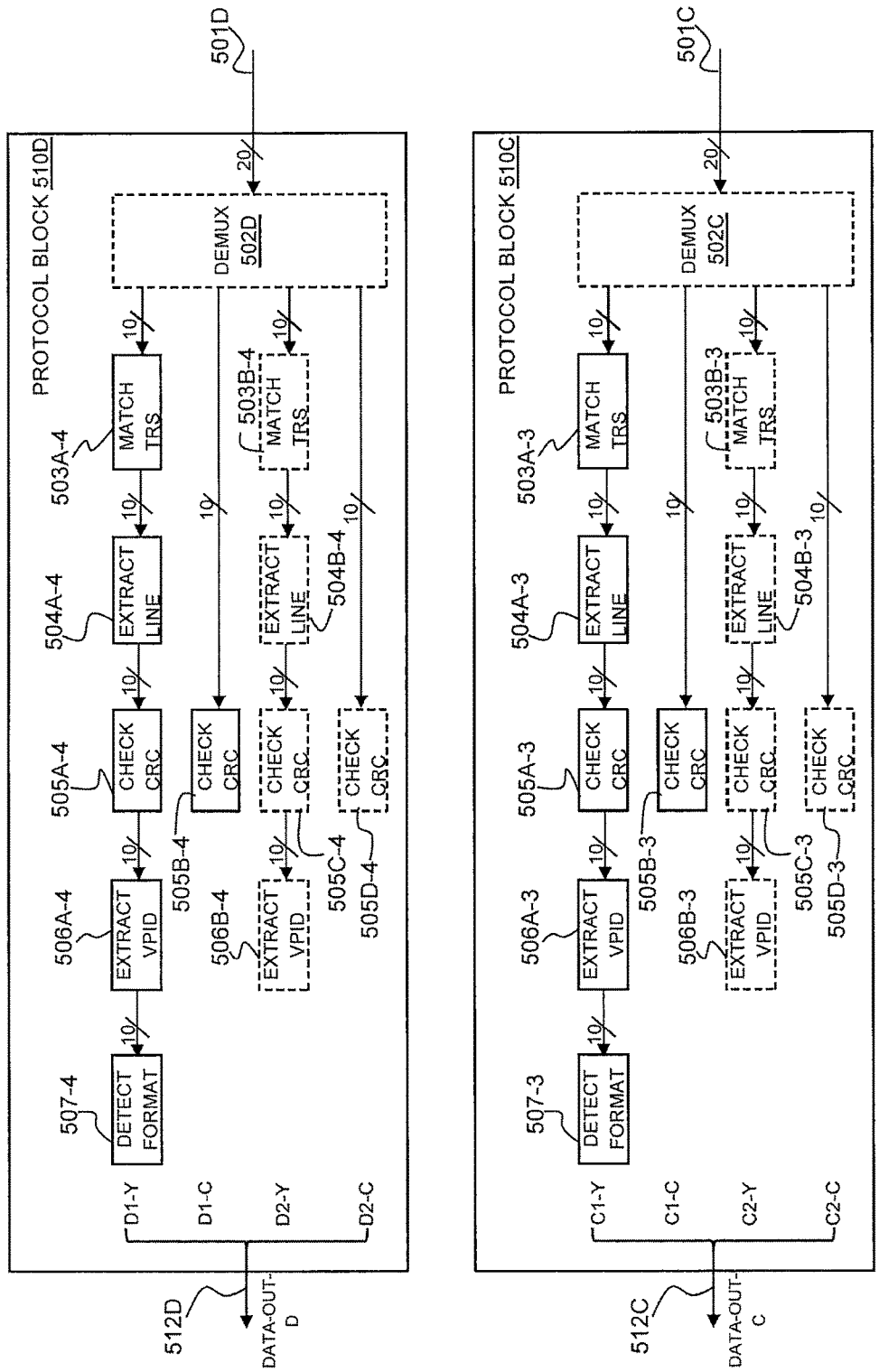

FIG. 5D shows protocol blocks in receiver circuit 500 and FIGS. 5D-1 and 5D-2 shows selected logic blocks in the respective protocol blocks that are enabled when a 11.88 or 11.868 Gbps 4K video stream is received. When a 11.88 or 11.868 Gbps (12G) 4K video stream is received, receiver circuit 500 may be dynamically reconfigured (by reconfiguration controller 560 based on the data rate of the received data stream RX-DATA-INPUT) to operate with an 80-bit interface and a 148.5 or 148.35 MHz recovered clock (again, depending on the video standard, PAL or NTSC, of the received video stream RX-DATA-INPUT).

In one scenario, deserializer 570 may transmit the 80-bit video stream as four parallel 20-bit streams to descrambler circuit 520. (Oversampler circuit 530 is bypassed or disabled in this scenario.) Descrambler circuit 520 descrambles the four 20-bit data streams while TRS aligner circuit 515 aligns the descrambled data streams before transmitting the aligned data streams to the respective input terminals 501A-501D of protocol blocks 510A-510D.

Referring next to FIGS. 5D-1 and 5D-2, demultiplexing circuits 502A-502D in the respective protocol blocks 510A-510D may be disabled as four 20-bit data streams representing four sub-images are transmitted concurrently to the respective protocol blocks 510A-510D via input terminals 501A-501D. Each of the protocol blocks 510A-510D may process a 20-bit data stream that represents a corresponding sub-image of the 80-bit 4K video stream.

As shown in FIG. 5D-1, logic blocks (match TRS block 503A-1, extract line block 504A-1, check CRC blocks 505A-1 and 505B-1, extract VPID block 506A-1, and detect format block 507-1) in protocol block 510A that are associated with streams A1-Y and A1-C are enabled. Logic blocks (match TRS block 503B-1, extract line block 504B-1, check CRC blocks 505C-1 and 505D-1, and extract VPID block 506B-1) associated with streams A2-Y and A2-C may be disabled. Accordingly, streams A1-Y and A1-C may be transmitted as DATA-OUT-A via output terminal 512A.

Similarly, in protocol block 510B, logic blocks (match TRS block 503A-2, extract line block 504A-2, check CRC blocks 505A-2 and 505B-2, extract VPID block 506A-2, and detect format block 507-2) that are associated with streams B1-Y and B1-C are enabled. Logic blocks (match TRS block 503B-2, extract line block 504B-2, check CRC blocks 505C-2 and 505D-2, and extract VPID block 506B-2) associated with streams B2-Y and B2-C may be disabled. Streams B1-Y and B1-C may be transmitted as DATA-OUT-B via output terminal 512B.

Referring next to FIG. 5D-2, logic blocks (match TRS block 503A-3, extract line block 504A-3, check CRC blocks 505A-3 and 505B-3, extract VPID block 506A-3, and detect format block 507-3) in protocol block 510C that are associated with streams C1-Y and C1-C are enabled. Logic blocks (match TRS block 503B-3, extract line block 504B-3, check CRC blocks 505C-3 and 505D-3, and extract VPID block 506B-3) associated with streams C2-Y and C2-C may be disabled. Accordingly, streams C1-Y and C1-C may be transmitted as DATA-OUT-C via output terminal 512C.

Similarly, in protocol block 510D, logic blocks (match TRS block 503A-4, extract line block 504A-4, check CRC blocks 505A-4 and 505B-4, extract VPID block 506A-4, and detect format block 507-4) that are associated with streams D1-Y and D1-C are enabled. Logic blocks (match TRS block 503B-4, extract line block 504B-4, check CRC blocks 505C-4 and 505D-4, and extract VPID block 506B-4) associated with streams D2-Y and D2-C may be disabled. Streams D1-Y and D1-C may be transmitted as DATA-OUT-D via output terminal 512D.

It should be noted that even though only four protocol blocks are shown in the embodiments of FIGS. 4A, and 5A-5D, it should be noted that more (or even fewer) protocol blocks may be used in a receiver circuit to potentially support data streams with higher resolutions (4K, 8K and beyond). In one scenario, the receiver circuit may operate at a constant reference clock irrespective of the data rate of the received data stream and irrespective of the number of protocol blocks used. In this scenario, as explained above, the receiver circuit may be dynamically reconfigured based on the data rate of the received data stream. As shown in FIG. 4A, reconfiguration controller circuit 460 may reconfigure a recovered clock signal in deserializer 470 (or more specifically, a CDR circuit within the deserializer) based on the data rate of the received data stream. Accordingly, by dynamically reconfiguring the receiver circuit to operate with different data widths and recovered clock frequencies, the receiver circuit may still be able to maintain a constant reference clock signal while receiving data streams with different data rates.

FIG. 6 shows illustrative method steps for operating transceiver circuitry in an IC in accordance with embodiments of the present invention. The transceiver circuitry may include a transmitter circuit similar to transmitter circuit 200 shown in FIG. 2A. As shown in FIG. 2A, transmitter circuit 200 may transmit data streams or video streams at different resolutions and data rates. Accordingly, at step 610, the data rate of the data stream being transmitted by the transceiver circuitry (or more specifically, the transmitter circuit within the transceiver circuitry) is determined.

At step 620, a control signal such as a data valid signal is set based on the data rate of the data stream being transmitted. In one scenario, the transceiver circuitry may receive and operate with a constant reference clock signal (e.g., a 148.5 MHz or a 148.35 MHz clock signal, depending on the video standard involved) irrespective of the data rate of the data stream being transmitted. In this scenario, as shown in FIG. 2A, clock enable generator 240 may generate DATA-VALID signal to scrambler block 220 (and other blocks in transmitter circuit 200) that may accordingly be used as a control signal to determine the appropriate data width for the scrambler circuit. Based on the control signal set, a scrambler circuit may be configured at step 630. In one scenario, the data widths of the respective input and output terminals of the scrambler circuit may be set based on the data rate of the data stream being transmitted. As shown in the embodiments of FIGS. 3A-3D, scrambler circuit 320 is set to operate at different data widths (20, 40 or 80 bits) depending on the data rate of the data stream being transmitted.

In one scenario, the transceiver circuitry may be set to operate at a predetermined data rate (e.g., 11.88 Gbps) and other circuits within the transceiver circuitry may be scaled according to the data rate of the data stream being transmitted. As an example, the transceiver circuitry may include an oversampling circuit that oversamples the data stream being transmitted by a factor that is calculated based on the date rate of the data stream and the predetermined operating data rate of the transceiver circuitry. As explained above with reference to FIGS. 3A-3D, oversampler circuit 330 may oversample the data streams being transmitted by different factors (e.g., 2×, 4×, 8× or 44×, depending on the ratio between the default data rate of transmitter circuit 300 and the desired data rate).

In one embodiment, the transceiver circuitry may include protocol blocks such as protocol blocks 210A-210D shown in FIG. 2A. Accordingly, at step 640, a portion of the protocol blocks may be selectively disabled based on the data rate of the data stream being transmitted. For example, more data blocks may be enabled for higher data rates while more data blocks may be disabled for lower data rates. (It should be noted that disabling a protocol block may simply involve bypassing the protocol block.) The embodiments shown in FIGS. 3A-3D highlight selected protocol blocks (and FIGS. 3A-1-3D-1 and 3D-2 show specific logic blocks within the selected protocol blocks) that may be enabled or disabled when transmitting video streams at different resolutions and data rates.

FIG. 7 shows illustrative method steps for operating a receiver circuit within transceiver circuitry in an IC in accordance with embodiments of the present invention. In one embodiment, the receiver circuit may be similar to receiver circuit 400 shown in FIG. 4A. At step 710, a data stream is received at the receiver circuit. As shown in FIG. 4A, receiver circuit 400 may receive data streams or video streams RX-DATA-INPUT at different resolutions and data rates. At step 720, the receiver circuit may detect the data rate of the received data stream. As an example, video standard detector 480 of FIG. 4A detects the data rate and the type of video standard received. The receiver circuit may also include a deserializer circuit that deserializes the received data stream. Accordingly, at step 730, the deserializer circuit may be configured based on the data rate of the receiver data stream.

In one scenario, the receiver circuit may receive a constant reference clock signal (e.g., a 148.5 MHz or a 148.35 MHz clock signal, depending on the video standard involved) irrespective of the data rate of the received data stream. The receiver circuit may further be set to operate at a predetermined data rate (e.g., 11.88 Gbps). In this scenario, based on the data rate of the received data stream, the recovered clock signal in the deserializer circuit and the output width of the deserializer circuit, and other circuit elements within the receiver circuit, may be set and scaled accordingly. In one scenario, the data widths of the input and output terminals of circuit elements (e.g., deserializer circuit, oversampler circuit, descrambler circuit, TRS aligner circuit, etc.) within the receiver circuit may be set based on the data rate of the data stream being transmitted.

As explained above with reference to the embodiments of FIGS. 5A-5D, the recovered clock signal RECOVERED-CLOCK may be set to different frequencies depending on the data rate of the received data stream. In one embodiment, the receiver circuit may include protocol blocks such as protocol blocks 410A-410D shown in FIG. 4A. Accordingly, at step 740, selected protocol blocks may be selectively disabled or bypassed based on the data rate of the received data stream. For example, when a data stream with a higher data rate is received, more protocol blocks may be enabled (or fewer protocol blocks disabled). Conversely, when the received data stream has a lower data rate fewer protocol blocks may be enabled (or more protocol blocks enabled). The embodiments shown in FIGS. 5A-5D highlight selected protocol blocks (and FIGS. 5A-1-5D-1 and 5D-2 show specific logic blocks within the selected protocol blocks) that may be enabled or disabled when receiving video streams at different resolutions and data rates.

It is noted that even the embodiments described above have been described with respect to programmable logic circuits, the methods and apparatus described herein may be advantageously incorporated into any suitable integrated circuit. For example, these method and apparatus may also be incorporated into numerous types of devices such as microprocessors or other integrated circuits. Other examples of such integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

Additional Embodiments

Additional embodiment 1. A method including: receiving a data stream at a receiver circuit; with a detector circuit in the receiver circuit, detecting data rate of the data stream received; and with a controller block in the receiver circuit, configuring a deserializer circuit in the receiver circuit based on the data rate of the data stream.

Additional embodiment 2. The method defined in claim 1, further including: irrespective of the data rate of the data stream received, receiving a constant reference clock signal at the receiver circuit.

Additional embodiment 3. The method defined in claim 2, wherein configuring the deserializer circuit includes: setting a data width of the deserializer circuit based on the data rate of the data stream; and setting a frequency of a recovered clock signal based on the data rate of the data stream.

Additional embodiment 4. The method defined in claim 1, wherein the receiver circuit operates at a predetermined data rate, the method further including: with an oversampling circuit in the receiver circuit, oversampling the data stream by a factor that is calculated based on the data rate of the data stream and the predetermined data rate.

Additional embodiment 5. The method defined in claim 1, wherein the receiver circuit includes multiple protocol blocks, the method further including: selectively disabling at least a portion of the protocol blocks based on the data rate of the data stream.

Additional embodiment 6. A method of operating a transmitter circuit in an integrated circuit, the method including: determining a data rate of a data stream being transmitted out of the transmitter circuit; setting a control signal based on the data rate of the data stream; and configuring a scrambler circuit in the transmitter circuit based on the control signal.

Additional embodiment 7. The method defined in claim 6 further including: irrespective of the data rate of the data stream being transmitted, receiving a constant reference clock at the transmitter circuit.

Additional embodiment 8. The method defined in claim 7, wherein configuring the scrambler circuit includes: setting a data width of the scrambler circuit based on the control signal.

Additional embodiment 9. The method defined in claim 6, wherein the transmitter circuit includes multiple protocol blocks, the method further including: selectively disabling at least a portion of the protocol blocks based on the data rate of the data stream being transmitted.

Additional embodiment 10. The method defined in claim 6 further including: receiving a constant reference clock at the transmitter circuit irrespective of the data rate of the data stream.

Additional embodiment 11. The method defined in claim 6, wherein the transmitter circuit operates at a predetermined data rate, the method further including: with an oversampling circuit in the transmitter circuit, oversampling the data stream by a factor that is calculated based on the data rate of the data stream and the predetermined data rate.

Additional embodiment 12. Circuitry including: a deserializer circuit that receives a data stream from an element that is external to the circuitry, wherein the deserializer circuit has an adjustable data width determined by a data rate associated with the data stream; and an oversampler circuit that receives the data stream from the deserializer circuit, wherein the oversampler circuit samples the data stream based on the data rate associated with the data stream and a predetermined data rate.

Additional embodiment 13. The circuitry defined in additional embodiment 12, wherein the deserializer circuit is configured to operate at an initial default data rate, and wherein the deserializer circuit is reconfigured during runtime based on the data rate associated with the data stream.

Additional embodiment 14. The circuitry defined in additional embodiment 13 further including: a control circuit that adjusts a data width of the deserializer circuit based on the data rate associated with the data stream.

Additional embodiment 15. The circuitry defined in additional embodiment 13, wherein the deserializer and the oversampler circuits form a receiver circuit, wherein the receiver circuit includes: multiple protocol blocks coupled to the oversampler circuit, wherein the protocol blocks receive the data stream from the oversampler circuit, and wherein at least a portion of the protocol blocks is disabled based on the data rate associated with the data stream.

Additional embodiment 16. The circuitry defined in additional embodiment 15, wherein the protocol blocks include four protocol blocks, and wherein each protocol block of the four protocol blocks includes a 20-bit input terminal and a 20-bit output terminal.

Additional embodiment 17. The circuitry defined in additional embodiment 16, wherein at least one of the four 20-bit input terminals and a respective 20-bit output terminal is disabled based on the data rate associated with the data stream.

Additional embodiment 18. Transmitter circuitry including: multiple protocol blocks, wherein at least one protocol block of the protocol blocks is enabled to transmit a data stream; and a scrambler circuit coupled to the protocol blocks, wherein the scrambler circuit is configurable during runtime based on a data rate associated with the data stream.

Additional embodiment 19. The transmitter circuitry defined in additional embodiment 18, wherein the protocol blocks include four protocol blocks, and wherein each protocol block of the four protocol blocks includes a 20-bit input terminal and a 20-bit output terminal.

Additional embodiment 20. The transmitter circuitry defined in additional embodiment 19, wherein at least one of the four 20-bit input terminals and a respective 20-bit output terminal is disabled based on data rate associated with the data stream.

What is claimed is:

1. A method comprising:
   receiving a data stream at a receiver circuit;
   with a detector circuit in the receiver circuit, detecting data rate of the data stream received;
   with a controller block in the receiver circuit, configuring a deserializer circuit in the receiver circuit based on the data rate of the data stream; and
   irrespective of the data rate of the data stream received, receiving a constant reference clock signal at the receiver circuit.

2. The method defined in claim 1, wherein configuring the deserializer circuit comprises:

setting a data width of the deserializer circuit based on the data rate of the data stream; and setting a frequency of a recovered clock signal based on the data rate of the data stream.

3. The method defined in claim 1, wherein the receiver circuit operates at a predetermined data rate, the method further comprising:

with an oversampling circuit in the receiver circuit, oversampling the data stream by a factor that is calculated based on the data rate of the data stream and the predetermined data rate.

4. The method defined in claim 1, wherein the receiver circuit comprises a plurality of protocol blocks, the method further comprising:

selectively disabling at least a portion of the plurality of the protocol blocks based on the data rate of the data stream.

5. Circuitry comprising:

a deserializer circuit that receives a data stream, wherein the data stream has a data rate;

an oversampling circuit that receives the data steam from the deserializer circuit;

a descrambler circuit that receives the data stream from the oversampling circuit and that is configured to apply descrambling algorithms to the data stream, wherein a data width of the descrambler circuit is adjusted based on the data rate of the data stream; and a plurality of protocol blocks that receives the data stream from the descrambler circuit.

6. The circuitry defined in claim 5, wherein the oversampling circuit is configured to oversample the data stream based on the data rate of the data stream.

7. The circuitry defined in claim 5, further comprising:

clock and data recovery circuitry that generates a recovered clock signal; and a rate detector circuit that receives the recovered clock signal from the clock and data recovery circuitry.

8. The circuitry defined in claim 7, wherein the rate detector circuit is configured to determine the frequency of the recovered clock signal.

9. The circuitry defined in claim 8, wherein the rate detector circuit generates a video rate output signal based on the frequency of the recovered clock signal.

10. The circuitry defined in claim 5, further comprising:

a video standard detector that receives the data stream from the deserializer circuit, wherein the video standard detector detects the data rate and the type of video standard of the data stream.

11. The circuitry defined in claim 10, further comprising:

a reconfiguration controller coupled to the deserializer circuit; and a state machine that receives the data rate from the video standard detector and that initiates a reconfiguration of the deserializer via the reconfiguration controller based on the data rate.

12. The circuitry defined in claim 11, wherein the reconfiguration controller is configured to dynamically reconfigure the deserializer based on the data rate.

13. The circuitry defined in claim 12, wherein the reconfiguration controller is configured to dynamically reconfigure clock and data recovery circuitry within the deserializer based on the data rate.

14. Circuitry comprising:

a deserializer circuit that receives a data stream from an element that is external to the circuitry, wherein the deserializer circuit has an adjustable data width determined by a data rate associated with the data stream; and an oversampler circuit that receives the data stream from the deserializer circuit, wherein the oversampler circuit samples the data stream based on the data rate associated with the data stream and a predetermined data rate.

15. The circuitry defined in claim 14, wherein the deserializer circuit is configured to operate at an initial default data rate, and wherein the deserializer circuit is reconfigured during runtime based on the data rate associated with the data stream.

16. The circuitry defined in claim 15 further comprising:

a control circuit that adjusts a data width of the deserializer circuit based on the data rate associated with the data stream.

17. The circuitry defined in claim 15, wherein the deserializer and the oversampler circuits form a receiver circuit, wherein the receiver circuit comprises:

a plurality of protocol blocks coupled to the oversampler circuit, wherein the plurality of protocol blocks receives the data stream from the oversampler circuit, and wherein at least a portion of the plurality of protocol blocks is disabled based on the data rate associated with the data stream.

18. The circuitry defined in claim 17, wherein the plurality of protocol blocks comprises four protocol blocks, and wherein each protocol block of the four protocol blocks comprises a 20-bit input terminal and a 20-bit output terminal.

19. The circuitry defined in claim 18, wherein at least one of the four 20-bit input terminals and a respective 20-bit output terminal is disabled based on the data rate associated with the data stream.

* * * * *